(12) United States Patent
Limberg

(10) Patent No.: US 6,445,425 B1
(45) Date of Patent: Sep. 3, 2002

(54) AUTOMATIC FINE TUNING OF RECEIVER FOR DIGITAL TELEVISION SIGNALS

(75) Inventor: Allen LeRoy Limberg, Vienna, VA (US)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/342,182

(22) Filed: Jun. 29, 1999

Related U.S. Application Data

(63) Continuation-in-part of application No. 08/822,736, filed on Mar. 24, 1997.
(60) Provisional application No. 60/034,610, filed on Jan. 7, 1997, and provisional application No. 60/111,016, filed on Dec. 4, 1998.

(51) Int. Cl.[7] ................................................. H04N 5/44
(52) U.S. Cl. ........................ 348/731; 348/725; 348/729
(58) Field of Search .............................. 348/731, 725, 348/729, 735, 726, 720, 723, 724; 375/316, 321; 455/130, 150.1, 154.1, 180.3, 182.1–182.3, 192.1–192.3; H04N 5/44

(56) References Cited

U.S. PATENT DOCUMENTS

| | | | | |
|---|---|---|---|---|
| 4,298,988 A | * | 11/1981 | Dages ....................... | 455/182.1 |
| 4,485,404 A | * | 11/1984 | Tults ........................... | 348/735 |
| 4,502,078 A | * | 2/1985 | Steckler et al. ............. | 348/727 |
| 4,599,652 A | * | 7/1986 | Carlson ....................... | 348/735 |
| 4,686,570 A | * | 8/1987 | Lewis et al. ................. | 348/614 |
| 5,331,290 A | * | 7/1994 | Harford et al. ............. | 330/254 |
| 5,390,348 A | * | 2/1995 | Magin et al. .............. | 455/182.2 |
| 5,479,449 A | * | 12/1995 | Patel et al. ................. | 375/316 |
| 5,565,932 A | * | 10/1996 | Citta et al. .................. | 348/678 |
| 5,606,579 A | * | 2/1997 | Patel et al. ................. | 348/725 |
| 5,636,252 A | * | 6/1997 | Patel et al. ................. | 348/729 |
| 5,659,372 A | * | 8/1997 | Patel et al. ................. | 348/475 |
| 5,737,035 A | * | 4/1998 | Rotzoll ........................ | 348/725 |
| 5,739,874 A | * | 4/1998 | Badger et al. .............. | 348/731 |
| 5,748,046 A | * | 5/1998 | Badger ........................ | 329/308 |
| 5,898,900 A | * | 4/1999 | Richter et al. .............. | 348/731 |
| 6,344,882 B1 | * | 2/2002 | Shim et al. ................. | 348/731 |

\* cited by examiner

*Primary Examiner*—John Miller
*Assistant Examiner*—Jean W. Désir
(74) *Attorney, Agent, or Firm*—Robert E. Bushnell, Esq.

(57) ABSTRACT

In a superheterodyne radio receiver designed for DTV reception, the IF amplifier chain for the VSB data modulation includes filtering having selective response to different portions of a received DTV signal, as translated to intermediate frequencies by a first detector. There is automatic fine tuning of a local oscillator included in the first detector to assure that the received DTV signal, as translated to intermediate frequencies by the first detector, is in proper alignment with the filtering having selective response to different portions of the received DTV signal. The bandpass filter used for extracting the frequencies near DTV carrier frequency for application to the AFT detector has a tilted amplitude response in passband that compensates for the roll-off of the DTV signal through the carrier region.

41 Claims, 17 Drawing Sheets

AUTOMATIC FINE TUNING OF RECEIVER FOR DIGITAL TELEVISION SIGNALS

This is a continuation-in-part of application Ser. No. 08/822,736 filed Mar. 24, 1997, under 35 U.S.C. 111(a) claiming pursuant to 35 U.S.C. 119(e)(1) benefit of the filing date of provisional application Ser. No. 60/034,610 filed Jan. 7, 1997, pursuant to 35 U.S.C. 111(b). This application also claims the benefit of the filing date of provisional application Ser. No. 60/111,016 filed Dec. 4, 1998, pursuant to 35 U.S.C. 111(b).

The invention relates to providing fine-tuning signals to the first detector in the radio receiver portions of television (TV) signal receivers for receiving digital television signals transmitted by terrestrial through-the-air television broadcasting in accordance with the Advanced Television Systems Committee (ATSC) standard.

BACKGROUND OF THE INVENTION

The first detector in a television signal receiver converts radio-frequency (RF) signals in a selected one of the television broadcast channels, which channels occupy various 6-MHz-wide portions of the electromagnetic wave frequency spectrum, to an intermediate-frequency (IF) signals in one particular 6-MHz-wide portion of that spectrum. This conversion is typically carried out by superheterodyning the RF signals, which is to say mixing the RF signals with local oscillations from a first local oscillator oscillating at a frequency substantially higher than the frequencies in the television channel of highest frequency, which mixing is done by linear multiplication in a first mixer. The first mixer is preferably of doubly balanced type. The first detector is used to convert a selected RF signal to IF signal in order that up to 60 dB or more amplification can be done in that particular 6-MHz-wide portion of that spectrum using IF amplifiers with fixed, rather than variable, tuning. Amplification of the received signals is necessary to raise them to power levels required for further signal detection operations, such as video detection and sound detection in the case of analog TV signals, and such as symbol decoding in the case of digital TV signals. The first detector usually includes variable tuning elements in the form of pre-selection filter circuitry for the RF signals to select among the various 6-MHz-wide television channels and in the further form of elements for determining the frequency of the local oscillations used for super-heterodyning the RF signals.

In analog TV signal receivers, which generally employ single-conversion radio receivers, the frequency of the oscillations supplied by the first local oscillator is often fine-tuned in response to an electric fine-tuning signal. This fine-tuning signal is generated by an automatic fine-tuning (AFT) feedback loop, which includes a bandpass filter responsive to the video carrier component of an IF amplifier response and an AFT detector that generates the electric fine-tuning signal. The AFT detector typically includes a limiter amplifier and a frequency discriminator tuned for prescribed video carrier frequency as translated to IF by the first detector. AFT is done to adjust the IF signal, so that the frequency-modulated (FM) audio carrier component of the selected TV channel as it appears in the amplified IF signal supplied to the video detector falls into the in-channel sound trap filter, and so that the FM audio carrier of an adjacent TV channel next below in frequency as it appears in the amplified IF signal supplied to the video detector falls into the adjacent-channel sound trap filter. Also, the IF amplifier amplitude response is rolled off 6 dB at video carrier frequency to provide matched filtering for the vestigial sideband (VSB) filter in the analog TV transmitter, so the IF signal should be aligned such that this amplitude equalization is correctly performed.

In some analog TV receivers of recent design first local oscillator signals are generated using a frequency synthesizer in which the first local oscillator signals are generated with frequency regulated in adjustable offset from the fixed frequency of a standard oscillator. This is advantageous if the frequency of the first local oscillations is to be fine-tuned in response to an electric fine-tuning signal, since electric fine-tuning of the frequency of the standard oscillator can be done (e.g., by using a varactor diode in an LC tank circuit) with the sensitivity of absolute frequency adjustment of first local oscillations to electric fine-tuning signal being constant no matter what the nominal frequency of the first local oscillator signals is.

Digital television (DTV) receivers known in the prior art did not use AFT of the first local oscillator. The data carrier of the VSB signal is nominally located 310 kHz from the lower limit frequency of the 6 MHz TV broadcast channel, and the uppermost sideband nominally extends to 310 kHz from the lower limit frequency of the 6 MHz TV broadcast channel. The IF amplifier bandwidths have been 6 MHz wide with less than a 1 dB ripple in amplitude response across the passband, so critical (fine) tuning has not been required.

Automatic fine tuning is desirable in a receiver for digital television (DTV) signals that uses a frequency synthesizer for tuning, even if the local oscillators in the receiver have extremely good frequency stability and are accurately tuned to prescribed nominal values. This is because transmitter carrier frequencies can be purposely tuned to depart as much as eight kilohertz from a frequency 310 kilohertz above a multiple of six megahertz. This is done to offset the pilot carrier frequency of a DTV signal from the color subcarrier of an NTSC signal on the lower adjacent channel by an odd multiple of one-half NTSC horizontal scan frequency, for reducing the visibility of color beat responses to the DTV pilot carrier.

Allowed patent application Ser. No. 08/822,736 points out that the introduction of in-channel and adjacent-channel sound trap filtering into the IF amplifier chain of a DTV receiver is advantageous in reducing the artifacts of NTSC signal interference that will accompany symbol codes recovered in a DTV receiver, during a transition era in which analog TV broadcasting continues still to be done. If such sound trap filtering is introduced into the IF amplifier chain amplifying DTV signals, it becomes advantageous to use AFT of the first local oscillator in a DTV receiver during the reception of DTV signals, patent application serial No. 08/822,736 points out.

Television signal receivers capable of receiving both digital television (DTV) signals transmitted in accordance with the ATSC broadcast standard and analog TV signals transmitted in accordance with the NTSC broadcast standard are described in the inventor's U.S. patent applications Ser. Nos. 08/825,711 and 08/820,193 filed Mar. 19, 1997, and respectively entitled RADIO RECEIVER DETECTING DIGITAL AND ANALOG TELEVISION RADIO-FREQUENCY SIGNALS WITH SINGLE FIRST DETECTOR and DIGITAL-AND-ANALOG-TV-SIGNAL RECEIVERS, EACH WITH SINGLE FIRST DETECTOR AND SHARED HIGH-BAND I-F AMPLIFICATION.

These applications are incorporated herein by reference for providing details of receiver construction not directly related to developing and utilizing automatic fine-tuning signals. The TV receivers described in these applications are of plural-conversion type, each using a single first detector both DTV signals and analog TV signals. The first detector generates ultra-high-frequency (UHF) intermediate-frequency signals. There are differing requirements for IF amplification of DTV signals and IF amplification of analog TV signals, so each of these TV receivers uses different IF amplifier chains for analog TV signals and for DTV signals. In some of these TV receivers the different IF amplifier chains for analog TV signals and for DTV signals do share some IF amplifier stages, however. The first detector generates ultra-high-frequency (UHF) intermediate-frequency signals which are subjected to frequency-selective filtering with bandwidth(s) just sufficient to pass the broadcast signal that is currently selected for reception, so automatic fine tuning (AFT) of first local oscillator signal is a practical necessity. When a single first detector is used both for DTV signal reception and for analog TV signal reception, problems of how properly to develop AFT signals arise. Solutions to these problems are described in patent application Ser. No. 08/822,736.

The derivation of AFT signals from the response of the IF amplifier chain for the amplitude-modulated NTSC video carrier is known from experience in analog TV signal receiver design to have problems, which problems arise owing to the 6 dB roll-off of video carrier that is customary for match filtering the vestigial sideband filter at the transmitter and at the same time helping in the design of the adjacent channel sound trapping. Accordingly, in an analog TV signal receiver design using a quasi-parallel IF amplifier chain for intercarrier sound, the bandpass filter for selecting video carrier to the AFT detector is connected to receive the response of the quasi-parallel IF amplifier chain, rather than the response of the IF amplifier chain for the amplitude-modulated NTSC video carrier supplied to the video detector.

The vestigial-sideband signal used for digital television broadcasting differs from the vestigial-sideband signal used in analog television broadcasting in that the spectrum roll-off of the upper frequencies of the amplitude modulation begins at a frequency below carrier frequency, rather than above carrier frequency. So, a substantially flat amplitude response through carrier region is not available, even with a quasi-parallel IF amplifier chain. Accordingly, it is here pointed out, the bandpass filter used for extracting the frequencies near DTV carrier frequency for application to the AFT detector should have a tilted amplitude response in passband that compensates for the roll-off of the DTV signal through the carrier region. This is done to secure sideband symmetry in the region around carrier, so that low-frequency modulation components will not affect the AFT. This is necessary because the ATSC standard does not provide for these low-frequency modulation components near carrier being suppressed together with the carrier. Allowing the low-frequency modulation components to affect AFT causes carrier phase modulation that is deleterious to decoding baseband symbol code properly.

Patent application Ser. No. 08/822,736 directed particular attention to the problems of developing fine-tuning signals to the first detector in the radio receiver portions of TV signal receivers for receiving DTV signals during the transition era in which analog TV broadcasting continues still to be done. However, automatic fine-tuning (AFT) of the local oscillator used in the first detector will still continue to be of importance in certain types of TV signal receivers for receiving DTV signals after the transition era—that is, when analog TV broadcasting is no longer done.

The ATSC data broadcast standard for terrestrial through-the-air television broadcasting prescribes a system channel response that is a linear-phase raised cosine filter response that is 6 dB down at 5.38 MHz bandwidth. This establishes a Nyquist slope at the higher-frequency end of the system channel response, and this establishes a corresponding slope 6 dB down at carrier frequency at the lower-frequency end of the system channel response. While not explicit in the published standard, half the higher-frequency roll-off is to be done at the transmitter, and half the lower-frequency roll-off is to be done at the transmitter. The remaining portions of these prescribed frequency roll-offs are to be accommodated at the receiver.

The inventor discerns that in most receivers for DTV signals, the remaining portions of these prescribed frequency roll-offs will be provided by filtering of the intermediate-frequency signals. The system channel response apparently was specified by persons more familiar with QAM data transmission than with VSB data transmission, since the frequency roll-off at the side of the channel proximate to the carrier frequency is referred to as a Nyquist slope in ATSC publications, as well as the frequency roll-off at the side of the channel distal from the carrier frequency. In QAM, which has both upper and lower sidebands that extend over respective frequency ranges each equal to half symbol rate, both of the frequency roll-offs are Nyquist slopes that affect the ability to distinguish changes between consecutive symbols. In a QAM data transmission system in which the Nyquist slope is only partially provided for at the transmitter, if the receiver uses the Viterbi algorithm for symbol decoding, it is known that the receiver need not complete the filtering for achieving the Nyquist slopes in order to decode the data symbols successfully.

In VSB data transmission the frequency roll-off at the side of the channel proximate to the carrier frequency is not a Nyquist slope, since it does not affect the ability to distinguish changes between consecutive symbols. In VSB data transmission, the frequency roll-off at the side of the channel proximate to the carrier frequency affects the regeneration of carrier in the receiver and affects the demodulated baseband response at frequencies close to zero frequency. The use of the Viterbi algorithm for symbol decoding does not help appreciably in solving these VSB reception problems. Error in the demodulated baseband response at frequencies close to zero frequency can be compensated for in the channel equalization circuitry and consequently is usually not of much concern. The greater concern is avoiding response to the pilot carrier being rolled off too much. Too much reduction in the pilot carrier amplitude adversely affects the automatic frequency-and-phase-lock loop of the local oscillator used for carrier regeneration, causing carrier jitter and increasing the likelihood of loss of synchronization of receiver carrier with transmitter carrier.

DTV receivers which do not introduce further roll-off of the system channel response in the RF and IF amplifiers avoid the problem of response to the pilot carrier being rolled off too much. However, such DTV receivers are undesirable in that the noise in the frequency spectrum extending up from carrier frequency is demodulated, reducing signal-to-noise in the baseband symbol coding recovered in the synchrodyne to baseband. Furthermore, in situations in which DTV signals are transmitted in adjacent channels, especially in those particular situations in which the adjacent-channel signal is strong relative to the signal selected for reception, it is desirable not to sacrifice the selectivity against adjacent-channel signals provided by rolling off to the specified system channel response. The adjacent-channel signals should be reduced enough in amplitude, if possible, that they do not cause intermodulation distortion with the signal selected for reception. Baseband signal resulting from demodulation of these adjacent-channel signals is above half-symbol frequency and can be rejected by lowpass filtering of the baseband symbol code. But intermodulation distortion occupies in part the same spectral region as baseband symbol code and cannot be separated therefrom by frequency-selective filtering. In DTV receivers that roll off IF amplifier response to the specified system channel response, to help reject adjacent-channel signals, AFT is desirable to avoid either response to the pilot carrier or response to half symbol frequency being rolled off too much.

DTV receivers are contemplated in which pilot frequency is boosted respective to other components in the amplified DTV IF signal supplied for demodulation in synchrodyning to baseband procedures. This boosting of pilot frequency reduces the carrier jitter and decreases the likelihood of loss of synchronization of receiver carrier with transmitter carrier. The boosting of pilot carrier amplitude has to be done with narrow selectivity and can be implemented by surface-acoustic-wave (SAW) filters in the IF amplifier chain for DTV signal. Automatic fine tuning is desirable in such a receiver, to maintain the pilot carrier of the received DTV signal as translated to intermediate frequency at the frequency which is boosted in the IF amplifier response supplied for demodulation.

SUMMARY OF THE INVENTION

In a superheterodyne radio receiver designed for DTV reception, the IF amplifier chain for the VSB data modulation includes filtering having selective response to different portions of a received DTV signal, as translated to intermediate frequencies by a first detector; and there is automatic fine tuning of a local oscillator included in the first detector to assure that the received DTV signal, as translated to intermediate frequencies by the first detector, is in proper alignment with the filtering having selective response to different portions of the received DTV signal. The bandpass filter used for extracting the frequencies near DTV carrier frequency for application to the AFT detector has a tilted amplitude response in passband that compensates for the roll-off of the DTV signal through the carrier region.

BRIEF DESCRIPTION OF THE DRAWING

Each of FIGS. 1, 2, 3, 4, 5, 6 and 7 is a schematic diagram of some of the radio receiver portions of a television receiver capable of receiving either analog TV signals or digital TV signals, which radio receiver portions include AFT circuitry and are as described in allowed application Ser. No. 08/822,736 filed Mar. 24, 1997.

Each of FIGS. 9, 10, 11, 12, 13, 14, 15, 16 and 17 is a schematic diagram of some of the radio receiver portions of a television receiver capable of receiving either analog TV signals or digital TV signals, which radio receiver portions include AFT circuitry and embody the invention.

Figure 9:
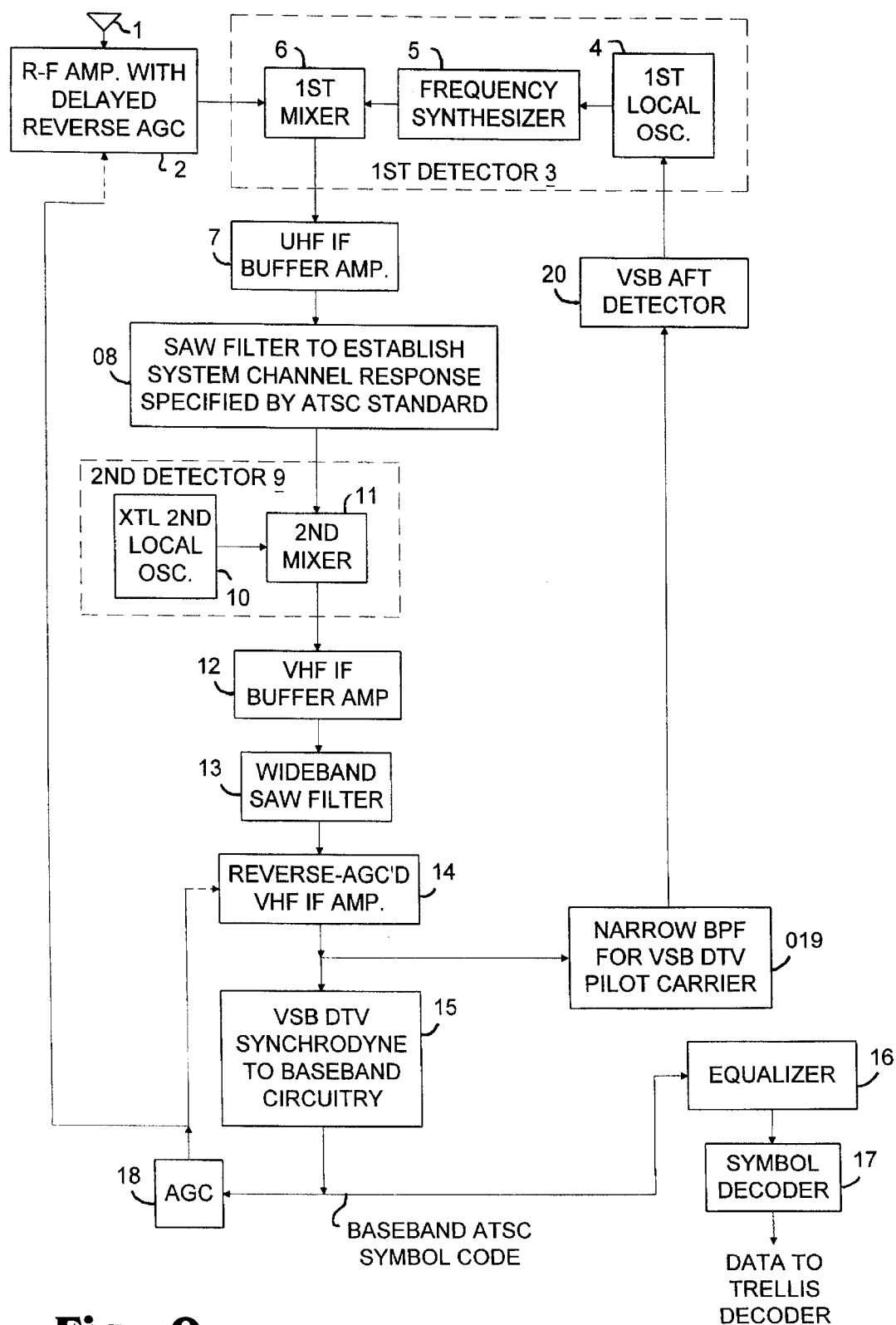

FIG. 9 is a schematic diagram of portions of a digital television receiver embodying the invention, in which receiver portions AFT circuitry is used to align the received digital television signal as translated to an ultra-high frequency (UHF) intermediate-frequency band, so that filtering in a UHF intermediate-frequency amplifier can establish the system channel response specified by the ATSC data broadcast standard.

Figure 10:
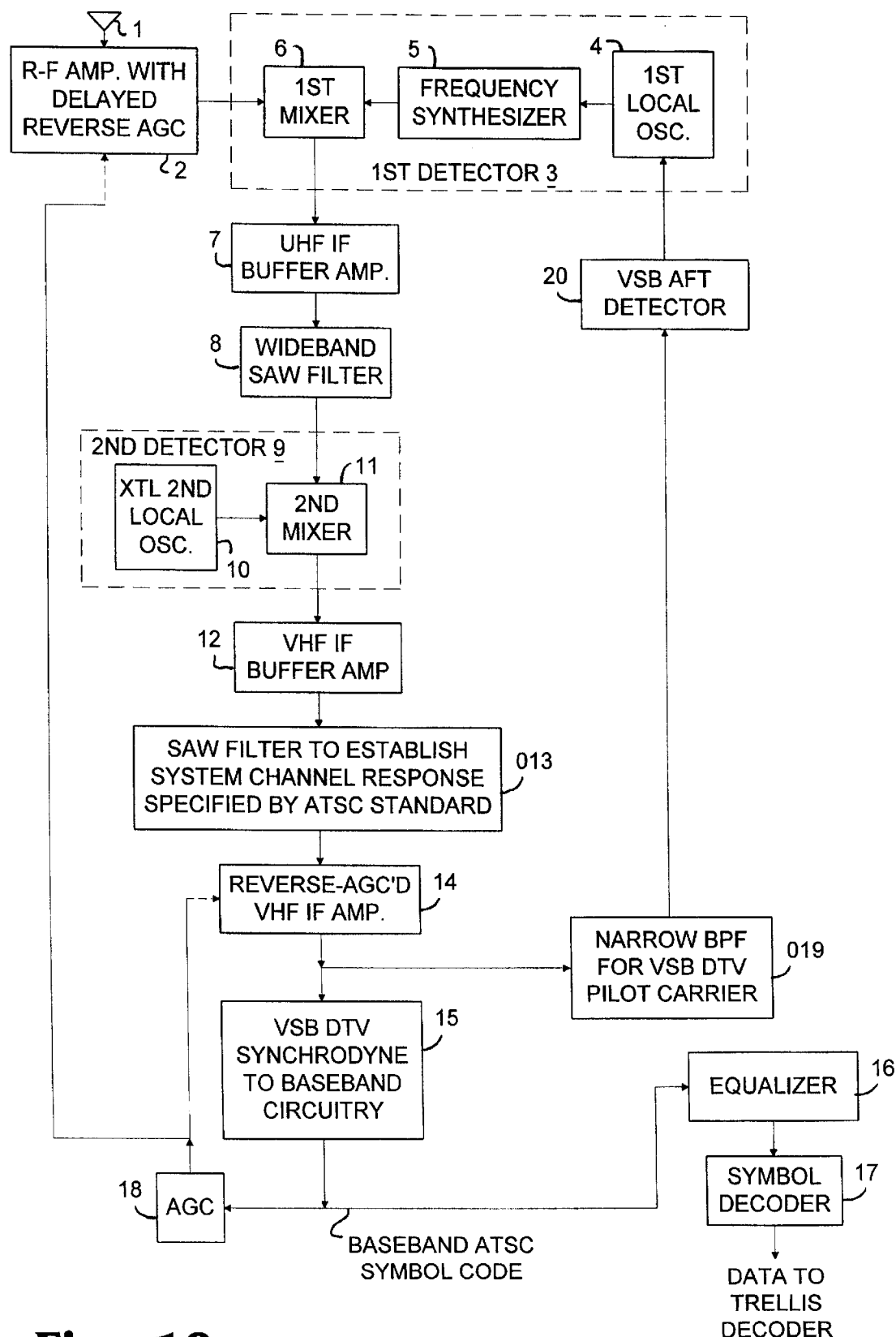

FIG. 10 is a schematic diagram of portions of a digital television receiver embodying the invention, in which receiver portions AFT circuitry is used to align the received digital television signal as translated to a very high frequency (VHF) band after having been translated to a UHF intermediate-frequency band, so that filtering in a VHF intermediate-frequency amplifier can establish the system channel response specified by the ATSC data broadcast standard.

Figure 11:
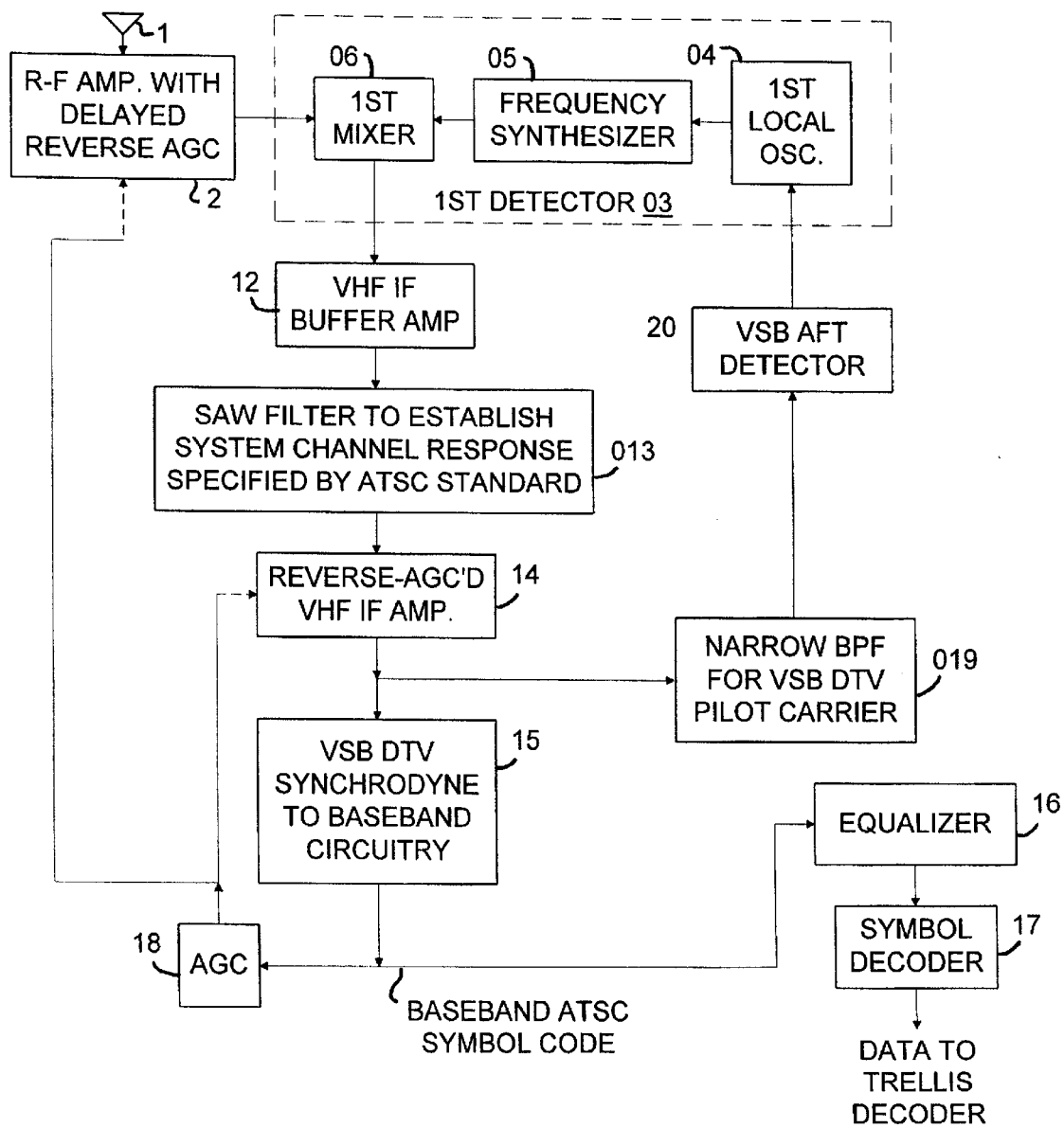

FIG. 11 is a schematic diagram of portions of a digital television receiver embodying the invention, in which receiver portions AFT circuitry is used to align the received digital television signal as translated to a very high frequency (VHF) band without having been translated to a UHF intermediate-frequency band, so that filtering in a VHF intermediate-frequency amplifier can establish the system channel response specified by the ATSC data broadcast standard.

Figure 12:
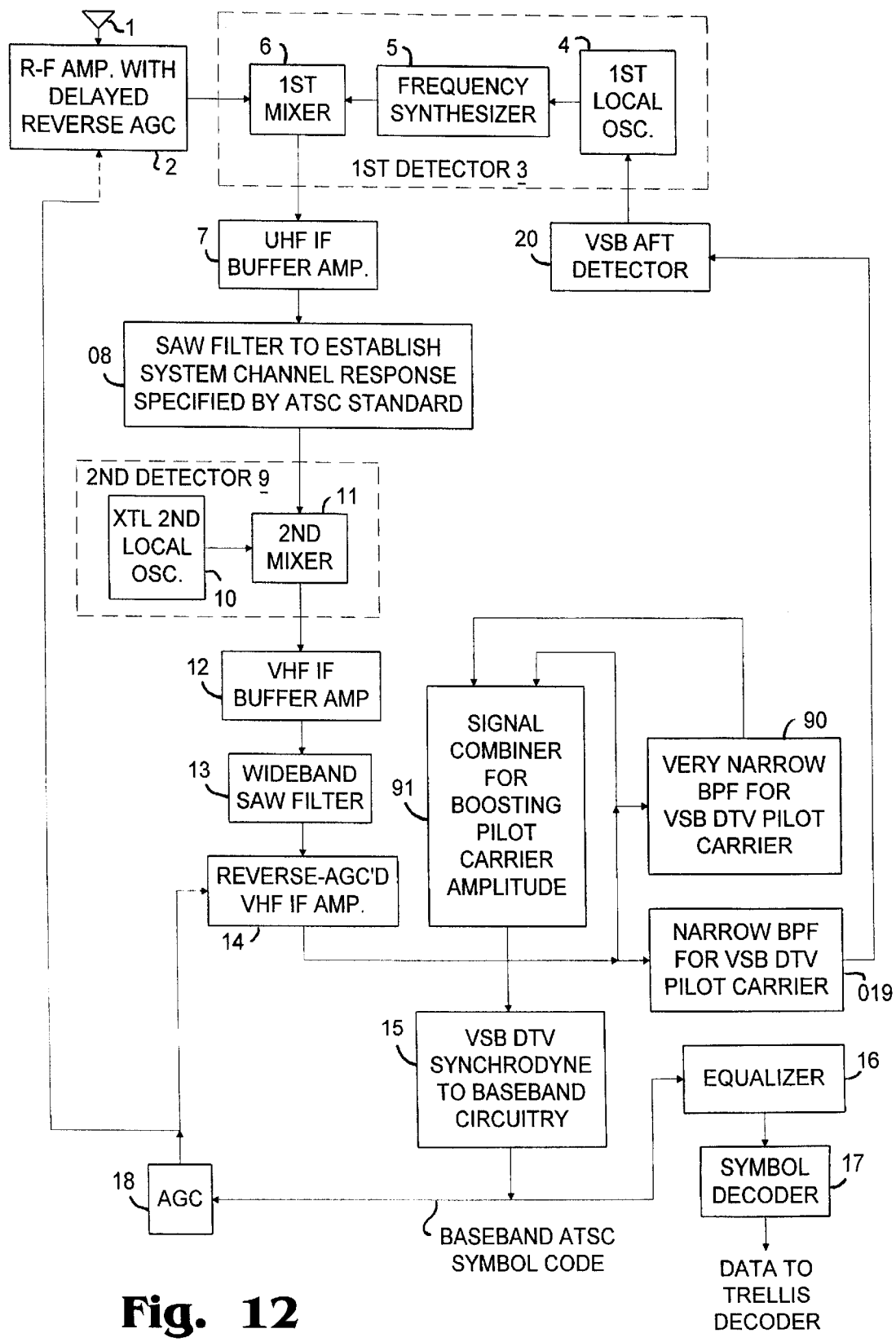

FIG. 12 is a schematic diagram of the portions of a digital television receiver shown in FIG. 9, as modified in a further embodiment of the invention such that modification pilot carrier amplitude is boosted in an intermediate-frequency amplifier response to received DTV signal.

Figure 13:
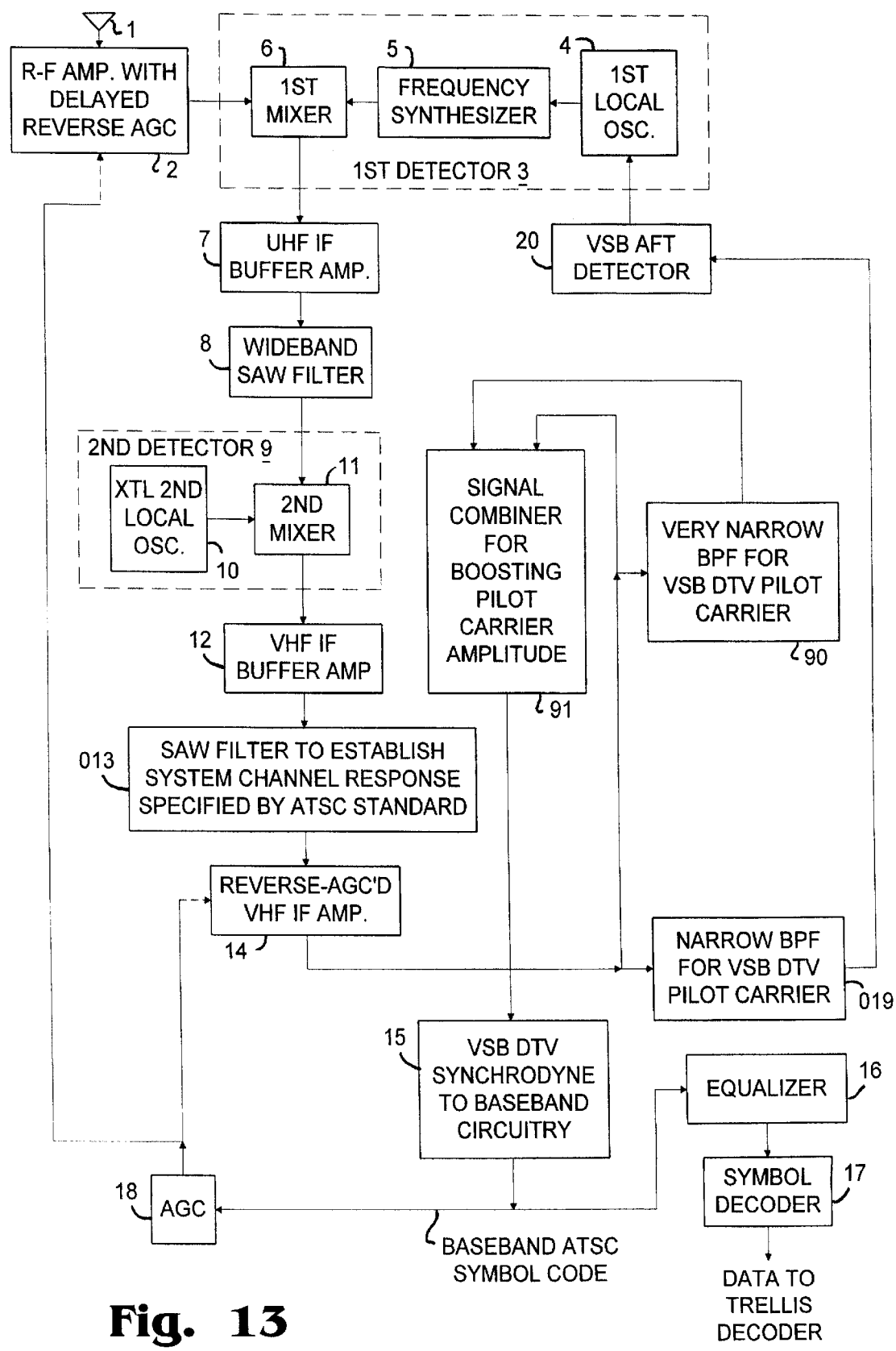

FIG. 13 is a schematic diagram of the portions of a digital television receiver shown in FIG. 10, as modified in a further embodiment of the invention such that modification pilot carrier amplitude is boosted in an intermediate-frequency amplifier response to received DTV signal.

Figure 14:
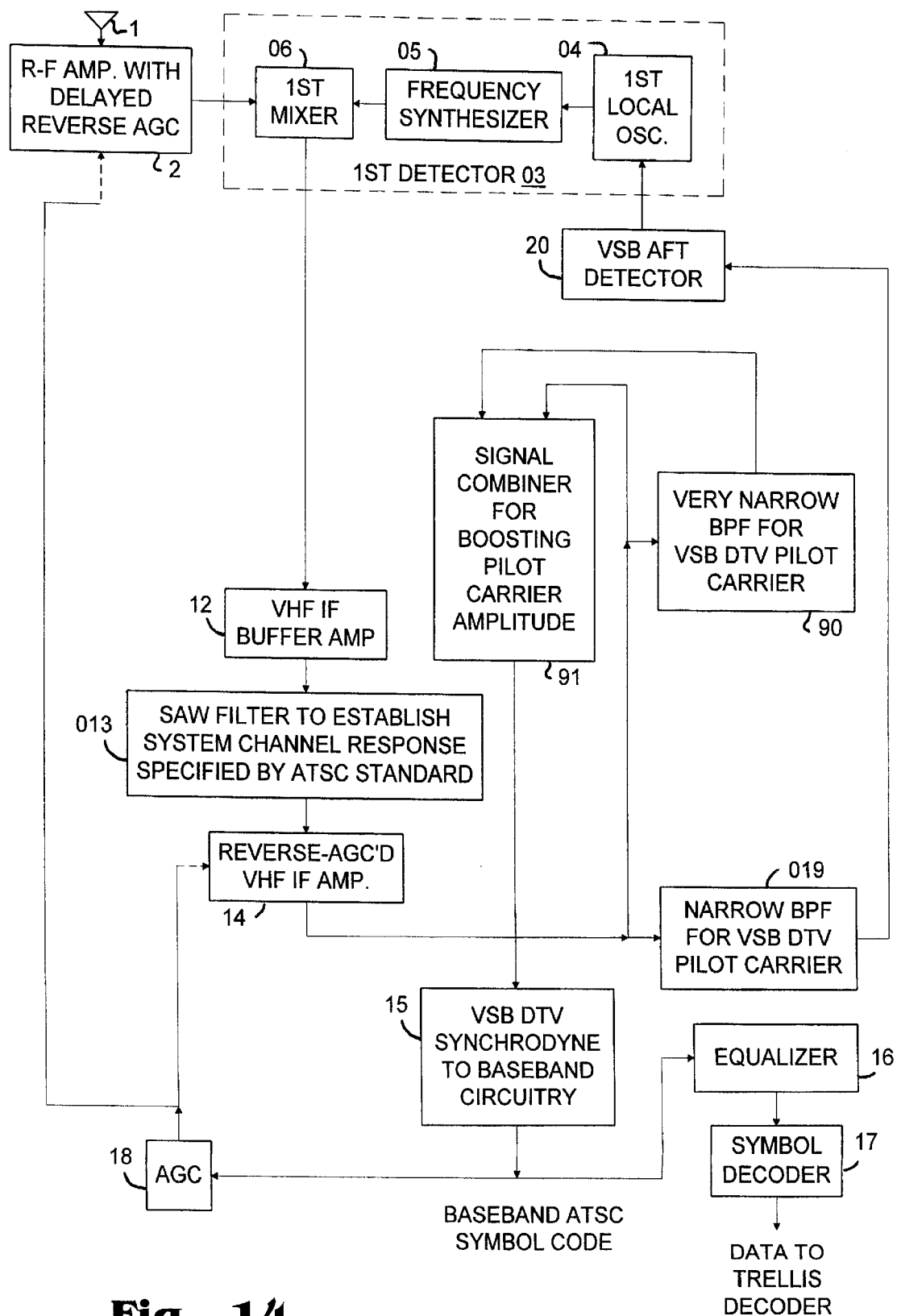

FIG. 14 is a schematic diagram of the portions of a digital television receiver shown in FIG. 11, as modified in a further embodiment of the invention such that modification pilot carrier amplitude is boosted in an intermediate-frequency amplifier response to received DTV signal.

Figure 15:
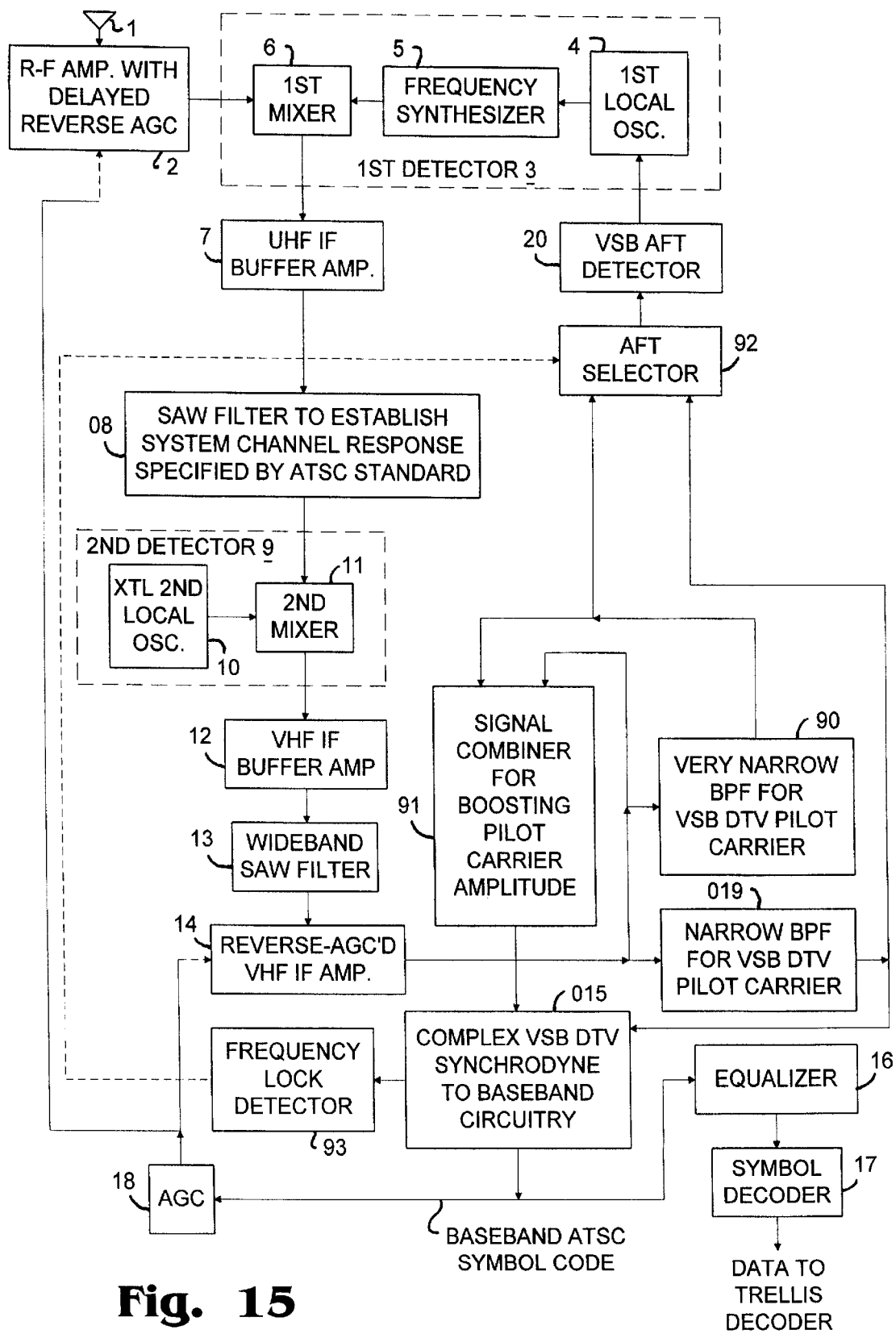

FIG. 15 is a schematic diagram of the portions of a digital television receiver shown in FIG. 12, as further modified in a further embodiment of the invention to use a dual-mode form of automatic fine-tuning.

Figure 16:
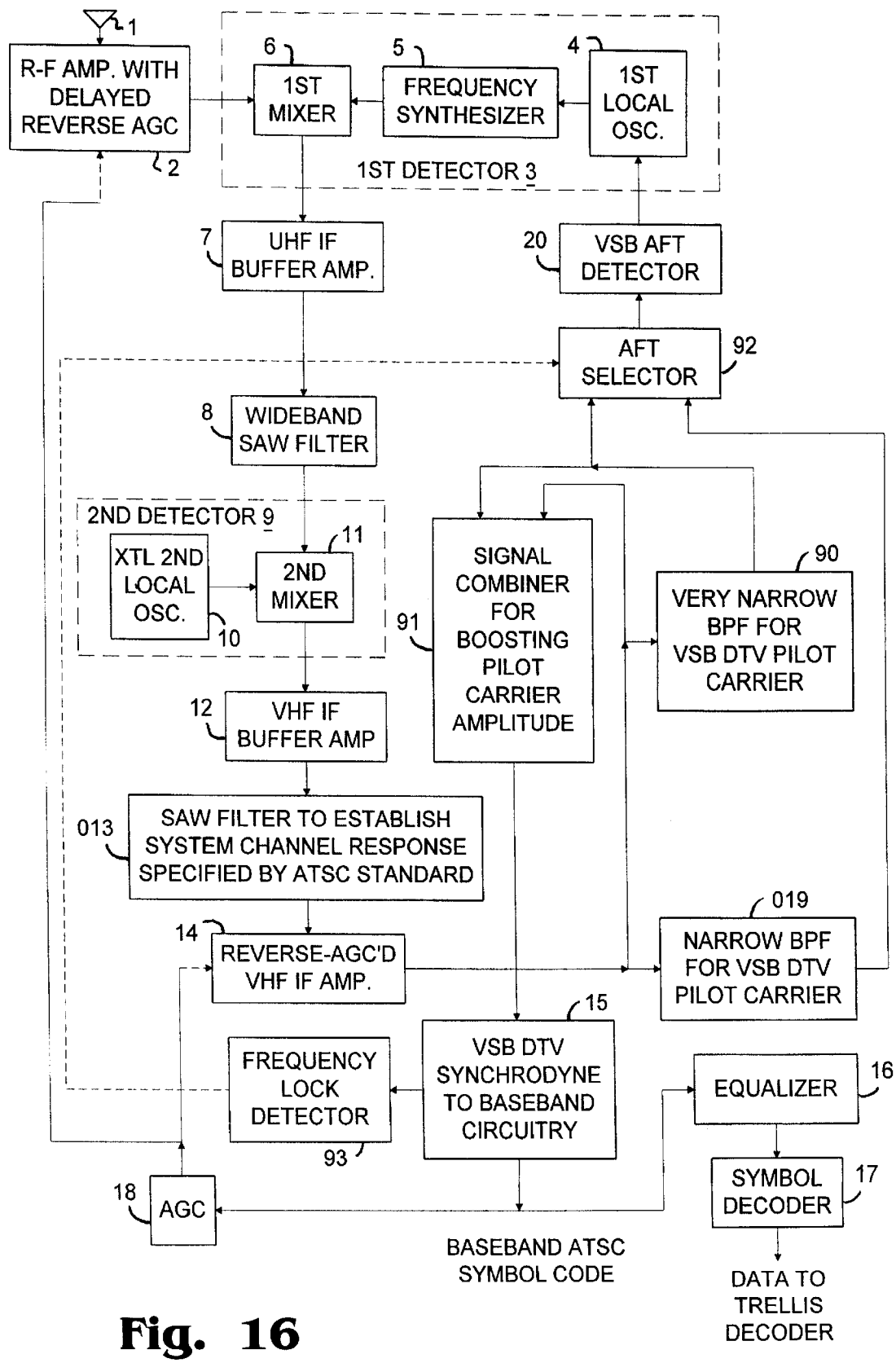

FIG. 16 is a schematic diagram of the portions of a digital television receiver shown in FIG. 13, as modified in a further embodiment of the invention to use a dual-mode form of automatic fine-tuning.

Figure 17:
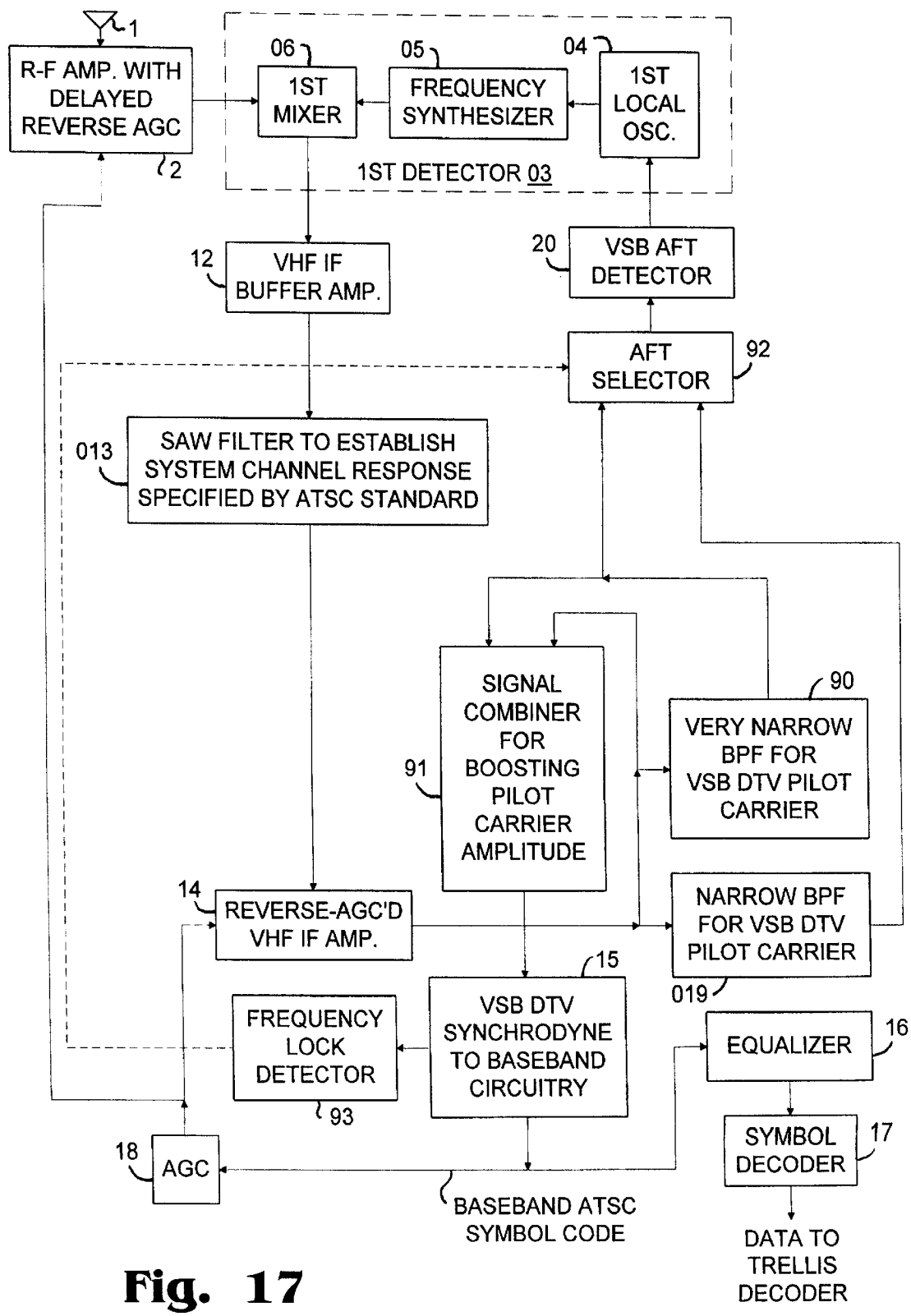

FIG. 17 is a schematic diagram of the portions of a digital television receiver shown in FIG. 14, as modified in a further embodiment of the invention to use a dual-mode form of automatic fine-tuning.

DETAILED DESCRIPTION

Figure 1:
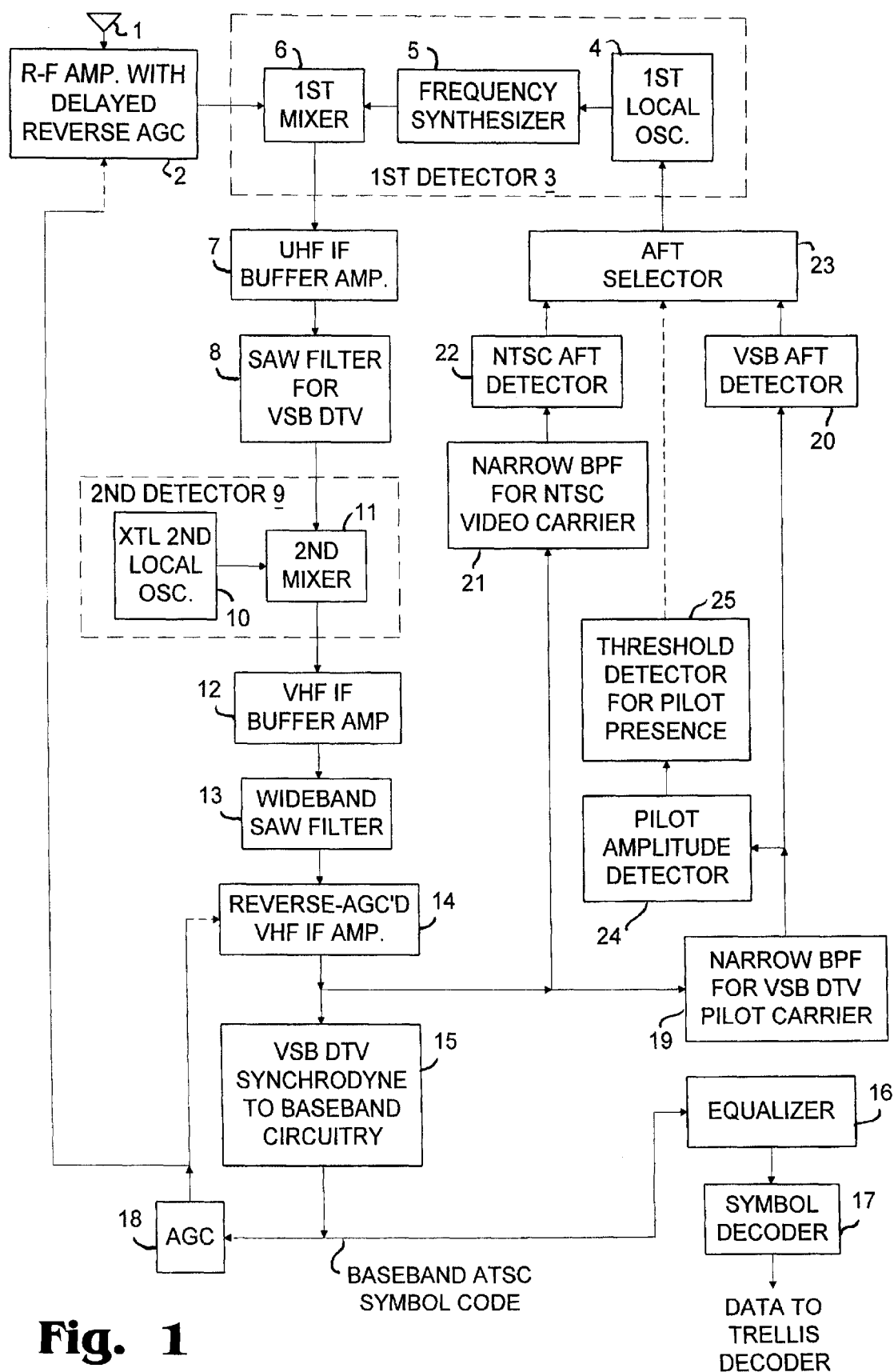
FIG. 1 shows the AFT circuitry including an AFT selector, which AFT selector selects AFT signal from an AFT detector tuned to DTV pilot frequency when a threshold detector senses the presence of DTV pilot carrier in the response of a pilot amplitude detector amplitude, and which AFT selector otherwise selects AFT signal from an AFT detector tuned to NTSC video carrier frequency.

FIG. 1 shows some of the radio receiver portions of a television receiver capable of receiving either analog TV signals or digital TV signals. These radio receiver portions include the first detector and the IF amplifier chain designed for amplifying DTV signals. An antenna 1 is a representative source of television signals in the very high frequency (VHF) and ultra high frequency (UHF) bands for application to a radio-frequency (RF) amplifier 2. The RF amplifier 2 is provided with a tracking pre-selection filter for selecting a portion of the one of the television broadcast bands the television signal selected for reception reposes in. The RF amplifier 2 supplies amplified response to the television signal selected for reception. This amplified response is supplied to a first detector 3 that comprises a first local oscillator 4 with automatic fine tuning, a frequency synthesizer 5 for generating super-heterodyning signal of a frequency in selected offset from the frequency of the first local oscillator, and a first mixer 6 for mixing the selected radio-frequency signal with the super-heterodyning signal to generate a UHF intermediate-frequency signal. The first mixer 6 includes an image-suppression filter, not explicitly shown in FIG. 1, for suppressing the image of that IF signal in its output signal and is preferably of a doubly-balanced linear-multiplication type. The image-suppression filter is typically a broadband coupling network including capacitors and inductors, which network provides a bandpass response. The first detector 3 translates the 6-MHz-wide selected radio-frequency signal so as to be nominally centered at an ultra-high frequency above that portion of the UHF band containing assigned channels for television broadcasting, placing the image frequencies well above 1 GHz so they are easily rejected by a bandpass coupling network. That is, the first detector 3 can by way of example be similar to prior-art first detectors in plural-conversion digital high-definition digital television (HDTV) receivers used by the Grand Alliance during field testing of terrestrial over-the-air HDTV broadcasting in accordance with the ATSC data broadcast standard, with the UHF IF signal being centered at 920 MHz.

The UHF IF signal supplied from the first detector 3 is applied via a buffer amplifier 7 to a surface-acoustic-wave filter 8 having a substantially linear-phase response and having an amplitude response that has a bandwidth of 5.7–6.0 MHz. This can be a flat-amplitude response having a −1 dB to −1 dB bandwidth of 5.7–6.0 MHz, to reduce the need for amplitude equalization after reproducing baseband symbol codes. The buffer amplifier 7 provides fixed gain to make up the 10–12 dB insertion loss of the SAW filter 8 and drives the SAW filter 8 from a fixed source impedance chosen to avoid unwanted reflections.

Figure 8:
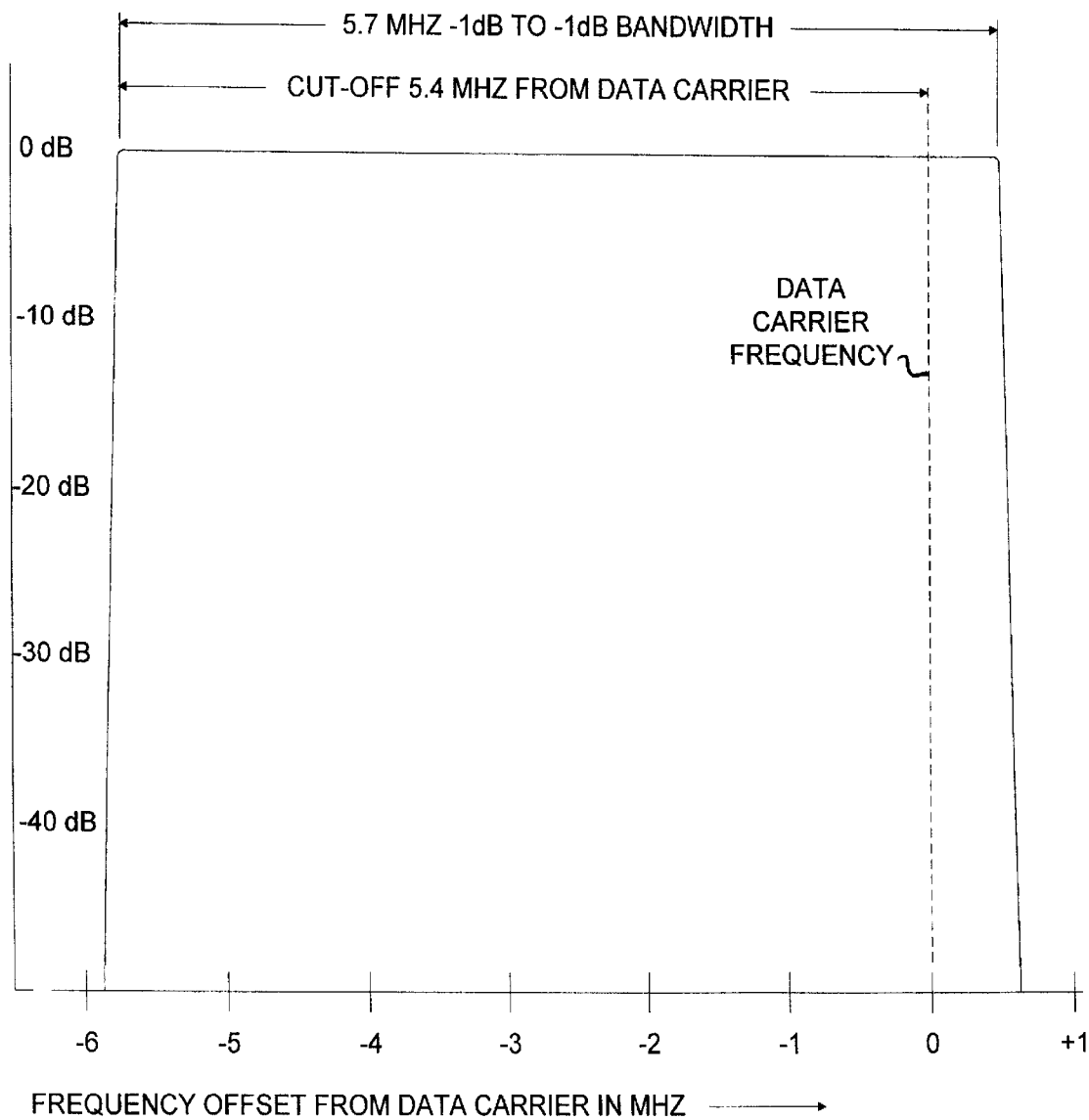
FIG. 8 is a graph of an ideal response for a bandpass filter used in the IF amplifier chain for DTV in the radio receiver portions of a TV receiver shown in any one of the FIGS. 1, 2, 3, 4, 5, 6 and 7.

FIG. 8 shows the amplitude response portion of a preferred ideal transfer characteristic for the SAW filter 8; the phase response portion of an ideal transfer characteristic for the SAW filter 8 is linear-phase throughout the passband. The ideal characteristic can be closely matched in actual practice, with some minor ripples in the passband. The SAW filter 8 cuts off rapidly just beyond 5.38 MHz remove from the suppressed carrier frequency and the pilot carrier, which is of like frequency and of fixed amplitude. This rapid cut-off can be achieved using trap filtering for the sound IF, with SAW filter 8 response exhibiting reduced attenuation at frequencies more than 5.85 MHz below data carrier frequency as translated to the UHF IF band. In any case, the SAW filter 8 rejects the frequency-modulated sound carrier of any co-channel interfering analog TV signal.

FIG. 8 shows that the SAW filter 8 cuts off rapidly approaching the edge of the UHF IF band which edge is 310 kHz above data carrier frequency as translated to that UHF IF band. The VSB signal used for DTV differs from that used in analog TV transmission in that the roll-off of the vestigial sideband begins at frequencies below the data carrier frequency rather than above the carrier frequency. Accordingly, there is no need or desire to have −6 dB roll-off at the data carrier frequency as translated to the UHF IF band. This facilitates the SAW filter 8 maintaining better phase linearity through the frequency range surrounding data carrier frequency.

A second detector 9 comprises a second local oscillator 10 for generating UHF second local oscillations and a second mixer 11 for mixing those second local oscillations with the SAW filter 8 response. The second local oscillator 10 is preferably a crystal-controlled oscillator generating UHF second local oscillations of fixed frequency. The second detector 9 downconverts the SAW filter 8 response to generate a very-high-frequency intermediate-frequency signal, applied via a buffer amplifier 12 to a surface-acoustic-wave filter 13. The buffer amplifier 12 provides fixed gain to make up the 15–17 dB insertion loss of the SAW filter 13 and drives the SAW filter 13 from a fixed source impedance chosen to avoid unwanted reflections. The second mixer 11 is a linear multiplier, and its design can be such as to eliminate the need for the ensuing buffer amplifier 12 before the SAW filter 13. The SAW filter 13 has a substantially linear-phase, flat-amplitude response over a bandwidth in excess of 6 MHz.

The SAW filter 8, rather than the SAW filter 13, is preferred for determining overall receiver response. The SAW filtering to define receiver bandwidth can be more easily implemented in a UHF band than in a VHF band, as long as care is taken to drive the SAW filter from the optimal source impedance specified by its manufacturer. This is because the Δf/f ratio of 6 MHz to UHF midband frequency is substantially lower than the Δf/f ratio of 6 MHz to VHF midband frequency. The SAW filter 13 eliminates the image of the VHF IF signal in its response applied to a plural-stage intermediate-frequency amplifier 14 as input signal thereto.

Synchrodyning circuitry 15 synchrodynes the amplified VHF IF signal supplied as output signal intermediate-frequency amplifier 14 to baseband, for reproducing baseband ATSC symbol codes supplied to an equalization filter 16 and thencefrom to a symbol decoder 17. A symbol decoder preferred by the inventor at the time of filing application for patent is described in his U.S. patent application Ser. No. 09/085,371 filed Jun. 18, 1999, entitled DTV RECEIVER SYMBOL DECODING CIRCUITRY WITH CO-CHANNEL NTSC ARTIFACTS SUPPRESSION FILTER BEFORE DATA SLICER, and incorporated herein by reference. U.S. Pat. No. 5,479,449 describes the synchrodyning circuitry 15 as including circuitry for converting the amplified second IF signal to a final IF signal somewhere in a 1–8 MHz band, an analog-to-digital converter for digitizing the final IF signal, and digital circuitry for completing the synchrodyne to baseband in the digital regime. Alternatively, as in the receivers used by the Grand Alliance during HDTV field testing, the synchrodyning circuitry 15 can be operative in the analog regime, with the analog baseband signal being digitized by an analog-to-digital converter for application to the equalizer circuitry 16. The equalizer circuitry 16 is then cascaded with a phase tracker operative at baseband.

Automatic gain control circuitry 18 responds to the baseband ATSC symbol codes for generating reverse AGC signals for stages in the IF amplifier 14 and a delayed reverse AGC signal for the RF amplifier 2. Reverse AGC is favored for maintaining linearity of the amplifier stages having controlled gain. Providing most of the controlled gain in the receiver in the VHF IF amplifier stages is preferred since stray capacitance interferes less with high gain per stage and with reducing the gain per stage. Modern VHF IF amplifier design relies on the input SAW filter for selectivity, the remainder of the amplifier being wideband. A suitable wideband amplifier having controlled gain is described by J. R. Harford et alii in U.S. Pat. No. 5,331,290 issued Jun. 19, 1994, entitled VARIABLE GAIN AMPLIFIER and incorporated herein by reference. The gain of the RF amplifier 2 is controlled to avoid non-linear multiplication by the first mixer 6 when very strong RF input signals are received.

The AGC circuitry 18 can take any of a number of known forms. In early Grand Alliance receivers the AGC circuitry for DTV signals used a matched filter responsive to data segment code groups, and of the response of this matched filter was peak detected to develop a basic AGC signal which was then use to develop delayed AGC for the IF amplifier stages. An AGC that responds to average symbol value can be used, as described by Citta et alii in U.S. Pat. No. 5,565,932 entitled AGC SYSTEM WITH PILOT USING DIGITAL DATA REFERENCE. Allowed U.S. patent application Ser. No. 08/573,454 filed Dec. 15, 1995 by C. B. Patel and the inventor, entitled AUTOMATIC GAIN CONTROL OF RADIO RECEIVER FOR RECEIVING DIGITAL HIGH-DEFINITION TELEVISION SIGNALS describes AGC circuitry that detects the direct component of the baseband signal generated by synchrodyning the pilot carrier to baseband during the reception of DTV signals.

In selective response to the amplified VHF IF signal that the intermediate-frequency amplifier 14 supplies as its output signal, a bandpass filter 19 applies to an automatic fine tuning detector 20 tuned for the frequency of the DTV pilot carrier (as translated to VHF intermediate frequency) a narrow band of frequencies including the nominal frequency of the DTV pilot carrier (as translated to VHF intermediate frequency). This narrow band is preferably about ±10 kHz wide with a tilted amplitude response in passband that compensates for the roll-off of the DTV signal through the carrier region that the IF amplifier 14 response exhibits. The AFT detector 20 develops an AFT signal in response to the DTV pilot carrier when the TV receiver receives a DTV signal of substantial strength.

In selective response to the amplified VHF IF signal that the IF amplifier 14 supplies as its output signal, a bandpass filter 21 applies to an automatic fine tuning detector 22 tuned for the frequency of the NTSC video carrier (as translated to VHF intermediate frequency) a narrow band of frequencies including the nominal frequency of the NTSC video carrier (as translated to VHF intermediate frequency). The AFT detector 22 develops an AFT signal in response to the NTSC video carrier when the TV receiver receives an analog TV signal of substantial strength.

If the AFT detector 20 is non-responsive in the absence of the DTV pilot carrier and if the AFT detector 22 is non-responsive in the absence of the NTSC video carrier, their output signals can simply be summed to generate the automatic fine-tuning signal applied to the first local oscillator 4. Preferably, an automatic fine-tuning signal selector 23 is employed to apply the AFT signal from the AFT detector 20 to the first local oscillator 4 when a DTV signal is currently being received or to apply the AFT signal from the AFT detector 22 to the first local oscillator 4 when an analog TV signal is currently being received.

In FIG. 1 the AFT signal selector 23 is controlled by means for determining when the TV signal currently being received is a VSB DTV signal, the TV signal currently being received otherwise being presumed to be an analog TV signal. FIG. 1 shows one form of such means, which comprises an amplitude detector 24 for detecting the amplitude of pilot carrier as translated to intermediate frequency in the selective response of the bandpass filter 19 and a threshold detector 25 responsive to the detected amplitude exceeding a prescribed threshold value for determining that the TV signal currently being received is a digital television signal.

Figure 2:
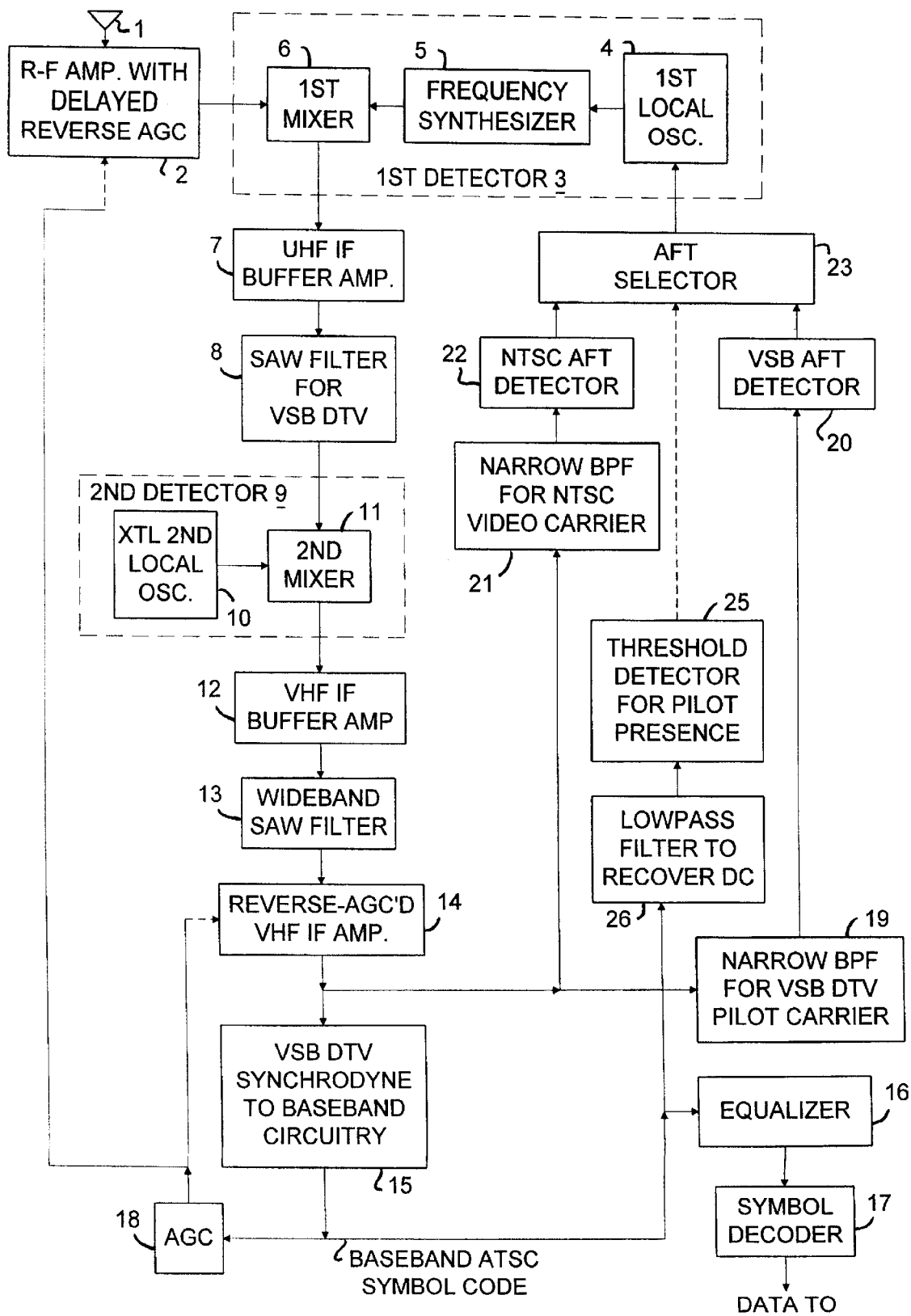
FIG. 2 shows the AFT circuitry including an AFT selector, which AFT selector selects AFT signal from an AFT detector tuned to DTV pilot frequency when a threshold detector senses the presence of a direct component accompanying baseband DTV symbol coding as reproduced in the receiver, and which AFT selector otherwise selects AFT signal from an AFT detector tuned to NTSC video carrier frequency.

FIG. 2, like FIG. 1, shows some of the radio receiver portions of a television receiver capable of receiving either analog TV signals or digital TV signals. In FIG. 2 the AFT signal selector 23 is also controlled by means for determining when the TV signal currently being received is a VSB DTV signal, but an alternative form of this means, which comprises a lowpass filter 26 for separating the direct component of the baseband ATSC symbol coding reproduced by the synchrodyning circuitry 15 and the threshold detector 25 responsive to the direct component exceeding a prescribed threshold value for determining that the TV signal currently being received is a digital television signal. The direct component accompanying the baseband ATSC symbol coding reproduced by the synchrodyning circuitry 15 is attributable to synchronous detection of the DTV pilot carrier signal.

Figure 3:
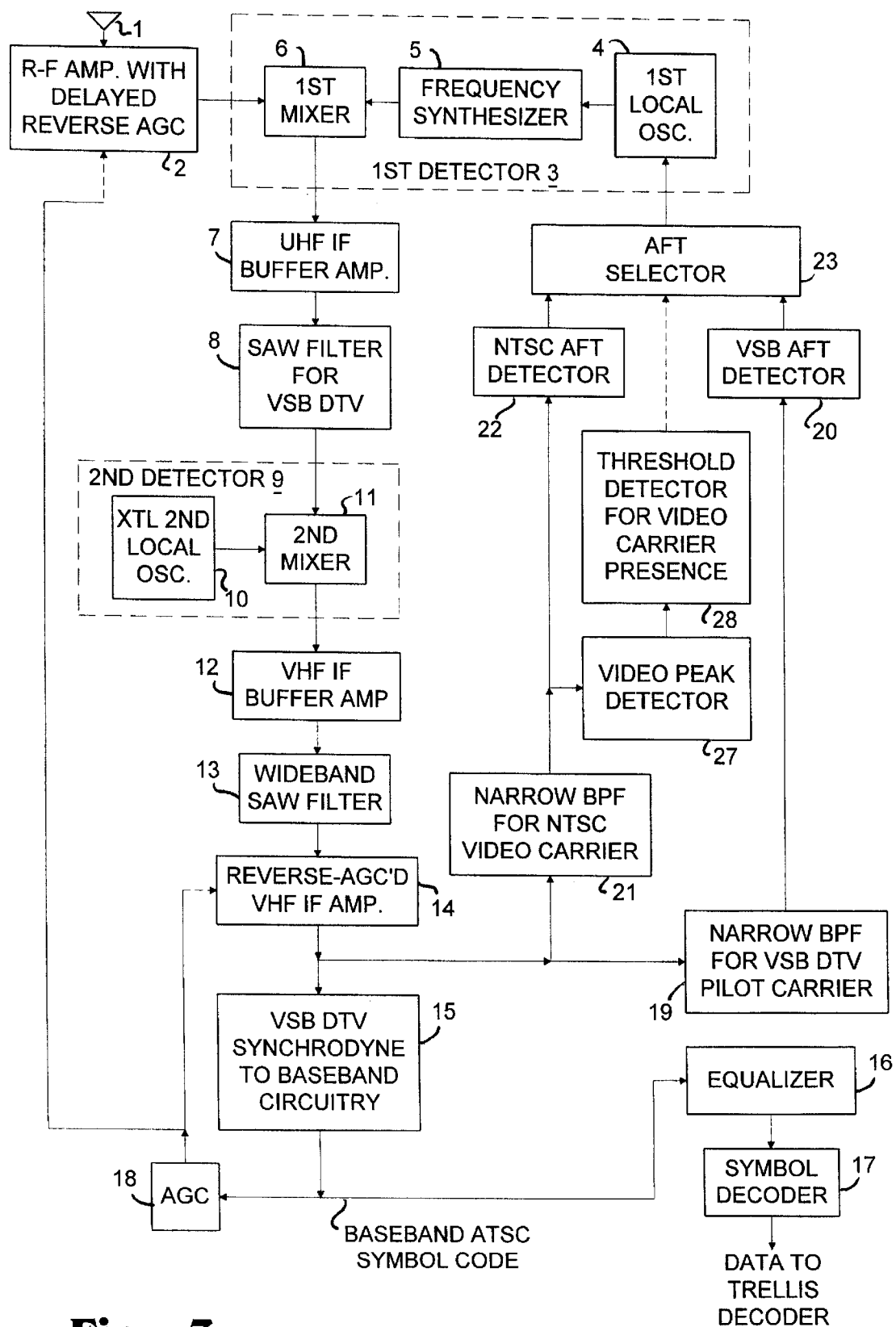
FIG. 3 shows the AFT circuitry including an AFT selector, which AFT selector selects AFT signal from an AFT detector tuned to video carrier frequency when a threshold detector senses the presence of video carrier in the response of a video peak detector, and which AFT selector otherwise selects AFT signal from an AFT detector tuned to DTV pilot frequency.

FIG. 3, like FIGS. 1 and 2, shows some of the radio receiver portions of a television receiver capable of receiving either analog TV signals or digital TV signals. In FIG. 3, however, the AFT signal selector 23 is controlled by means determining when the TV signal currently being received is an analog TV signal, the TV signal currently being received otherwise being presumed to be a VSB DTV signal. This means comprises a video peak detector 27 for detecting the peak excursion of the video carrier response of the bandpass filter 21 and a threshold detector 28 responsive to the detected peak excursion exceeding a prescribed threshold value for determining that the TV signal currently being received is an analog television signal.

Figure 4:
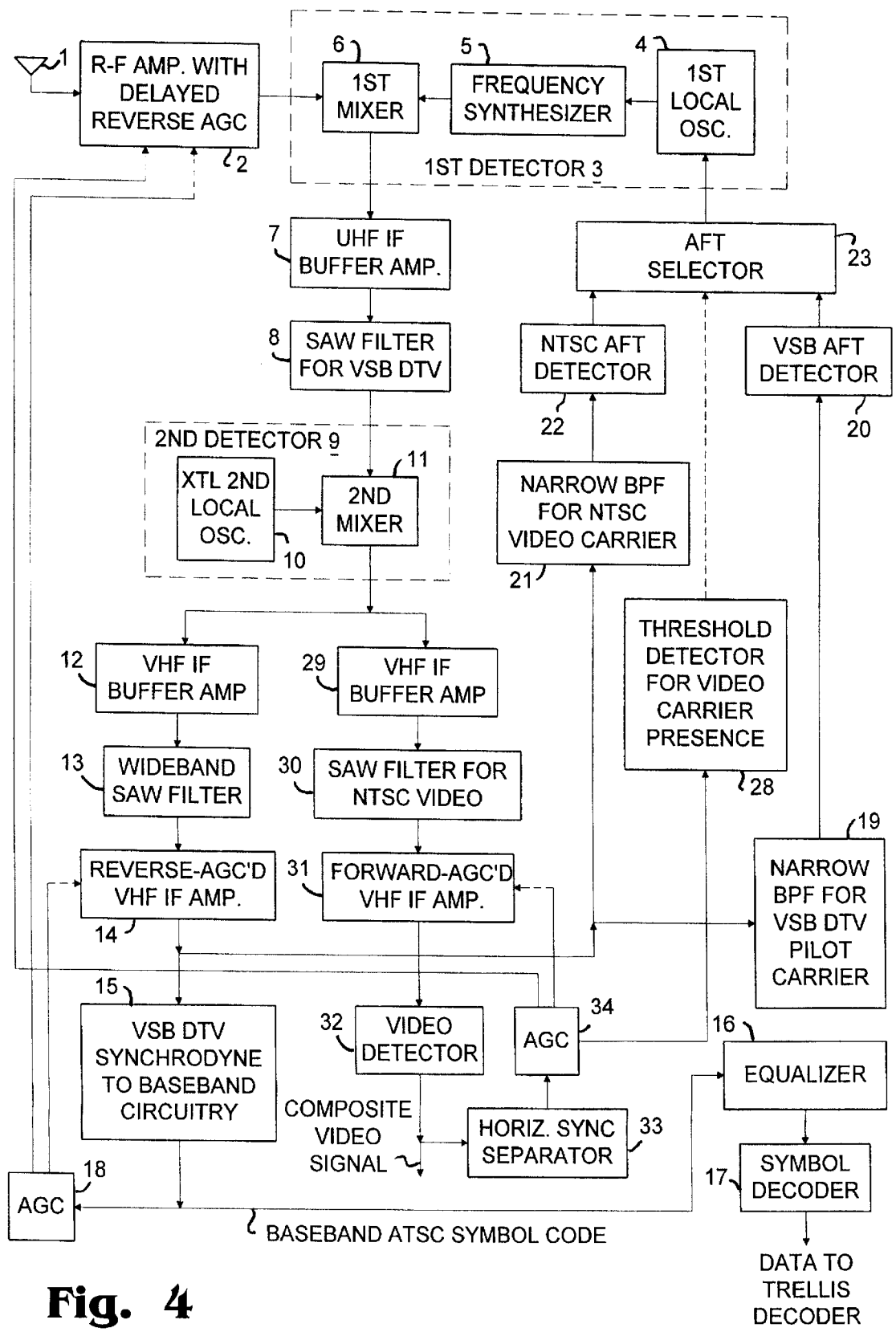
FIG. 4 shows the AFT circuitry including an AFT selector, which AFT selector selects AFT signal from an AFT detector tuned to video carrier frequency when a threshold detector senses the presence of video carrier from automatic gain control circuitry of an IF amplifier chain for amplifying NTSC video carrier modulation, and which AFT selector otherwise selects AFT signal from an AFT detector tuned to DTV pilot frequency, the IF amplifier chain for amplifying NTSC video carrier modulation sharing a UHF IF amplifier and second mixer with the IF amplifier chain for amplifying DTV modulation.
Figure 5:
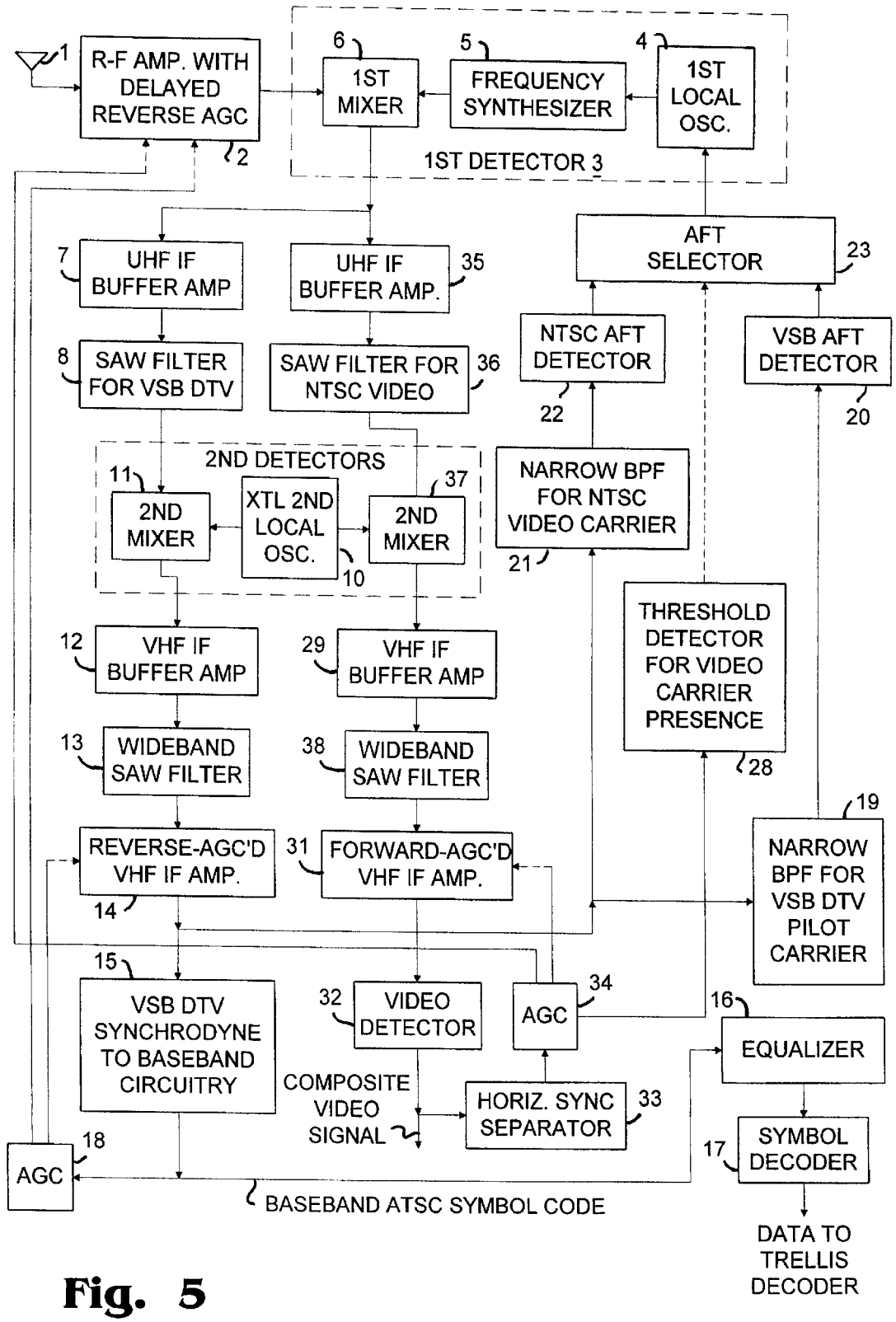
FIG. 5 shows the AFT circuitry including an AFT selector, which AFT selector selects AFT signal from an AFT detector tuned to video carrier frequency when a threshold detector senses the presence of video carrier from automatic gain control circuitry of an IF amplifier chain for amplifying NTSC video carrier modulation, and which AFT selector otherwise selects AFT signal from an AFT detector tuned to DTV pilot frequency, the IF amplifier chain for amplifying NTSC video carrier modulation being separate from the IF amplifier chain for amplifying DTV modulation except for sharing a common second local oscillator.

The peaks of video carrier modulation can be sensed at other points in the TV receiver than at the bandpass filter 21 output port, thereafter to be supplied to the threshold detector 28 responsive to the detected peak excursion exceeding a prescribed threshold value for determining that the TV signal currently being received is an analog television signal. For example, the NTSC video detector used during NTSC reception supplies baseband composite video signal to the horizontal synchronization detector, and the amplitudes of separated horizontal synchronizing pulses are detected by an automatic gain control (AGC) detector for developing automatic gain control signals for the forward-AGC'd VHF IF amplifiers used for NTSC signals. The AGC detector can be used for supplying the threshold detector 28 what is in effect peak detected video signal. FIGS. 4 and 5 show portions of two receivers which employ this method for supplying the threshold detector 28 what is in effect peak detected video signal.

FIG. 4 shows the VHF IF signal generated by the second detector 9 being applied via a buffer amplifier 29 to a surface-acoustic-wave filter 30 that provides −6 dB roll-off in overall IF gain at video carrier as translated to VHF intermediate frequency, as well as rejection of FM sound carrier as translated to VHF intermediate frequency. The SAW filter 30 is a match filter for the vestigial sideband filtering used at the NTSC video transmitter. An example of a SAW filter exhibiting the desired type of response for video carrier translated to 45.75 MHz and sound carrier translated to 41.25 MHz is the SAF45 MVB80Z manufactured by Murata Manufacturing Co., Ltd., in Erie, Pa. The buffer amplifier 29 provides fixed gain to make up the 15–17 dB insertion loss of the SAW filter 30 and drives the SAW filter 30 from a fixed source impedance chosen to avoid unwanted reflections. The buffer amplifiers 12 and 29 preclude any interactions between the SAW filters 13 and 30 arising from being driven directly from the second detector 9 as a common source. The VHF IF band defined by the frequency-selective response of the SAW filter 30 is amplified by an amplifier 31, with an earlier one of its stages provided forward AGC in order to maintain low noise figure during reduction of its gain by AGC. At least one of the later stages of the amplifier 31 must also be provided with AGC in order to provide the AGC range required of a commercial television receiver. The AGC of a later stage of the amplifier 31 can use forward AGC or reverse AGC per standard practices in analog TV receiver design. The amplified VHF IF signal supplied by the amplifier 31 as its output signal is applied to a video detector 32 as input signal thereto.

The video detector 32 can be either a synchronous detector or an envelope detector. Or, the video detector 32 can comprise a synchronous detector for supplying composite video signal to the luminance and chrominance separation circuitry of the receiver and can further comprise an envelope detector for supplying composite video signal to the sync separation circuitry of the receiver including a horizontal sync separator 33. The horizontal sync separator 33 supplies separated horizontal sync to automatic gain-control circuitry 34 that generates AGC signals for controlling the gains of stages in the VHF IF amplifier 31 and a delayed AGC signal for controlling the gain of the RF amplifier 2 during analog TV signal reception. The RF amplifier 2 responds to delayed AGC signal from AGC circuitry 34 during analog TV signal reception and to delayed AGC signal from AGC circuitry 18 during DTV signal reception. This can be arranged for using a pair of rectifying diodes connected to provide an analog OR circuit that selects the larger of the delayed AGC signals for controlling the gain of the RF amplifier 2 when necessary to forestall driving the first mixer 6 with an overlarge amplified RF signal. The AGC circuitry 34 follows a conventional design for an analog TV receiver, which designs typically detect the amplitude of the tips of horizontal synchronizing pulses to generate an AGC signal. In FIG. 4, however, this AGC signal is supplied to the threshold detector 28 as well as being used to control amplifier gains.

In FIG. 4 the IF amplifier chain for NTSC video carrier modulation includes the UHF IF buffer amplifier 7, the SAW filter 8, the second detector 9, the VHF IF buffer amplifier 29, the SAW filter 30 and the forward-AGC'd VHF IF amplifier 31. The IF amplifier chain for DTV modulation includes the UHF IF buffer amplifier 7, the SAW filter 8, the second detector 9, the VHF IF buffer amplifier 12, the SAW filter 13 and the reverse-AGC'd VHF IF amplifier 14.

FIG. 5 shows an alternative configuration in which the IF amplifier chain for NTSC video carrier modulation does not share the UHF IF buffer amplifier 7, the SAW filter 8 and the second mixer 11 with the IF amplifier chain for DTV modulation. Instead, the VHF IF signal for application to the buffer amplifier 29 is developed from the UHF IF signal supplied from the first detector 3 using a buffer amplifier 35, a surface-acoustic-wave filter 36 and a second mixer 37. The buffer amplifier 35 provides fixed gain to make up the 10–12 dB insertion loss of the SAW filter 36 and drives the SAW filter 36 from a fixed source impedance chosen to avoid unwanted reflections. The buffer amplifiers 7 and 35 preclude any interactions between the SAW filters 8 and 36 arising from being driven directly from the first detector 3 as a common source. The second mixer 37 receives second local oscillations from the second local oscillator 10 that also supplies the second mixer 11 with second local oscillations. The second local oscillator 10 and the second mixer 37 together form a second detector for SAW filter 36 response, downconverting that UHF IF response to a VHF IF signal for application to the buffer amplifier 29 as input signal thereto.

The SAW filter 36 provides for the −6 dB roll-off in overall IF gain at video carrier as translated to VHF intermediate frequency, as well as rejection of FM sound carrier as translated to VHF intermediate frequency. In FIG. 5 the SAW filter 36 is a match filter for the vestigial sideband filtering used at the NTSC video transmitter. So, accordingly, the SAW filter 30 used in FIG. 4 as a match filter for the vestigial sideband filtering used at the NTSC video transmitter is replaced in FIG. 5 by a SAW filter 38 that has a substantially linear-phase, flat-amplitude response over a bandwidth in excess of 6 MHz. The SAW filter 36, rather than the SAW filter 38, is preferably used for determining overall receiver response. The SAW filter 38 eliminates the image of the VHF IF signal in its response applied to the VHF IF amplifier 31 as input signal thereto.

The second mixers 11 and 37 are preferably each of a doubly-balanced linear-multiplication type. The buffer amplifiers 12 and 29 can be replaced by respective straight-through connections, providing that the second mixers 11 and 37 are designed to drive the SAW filters 13 and 38 from source impedances that minimize multiple reflections.

Figure 6:
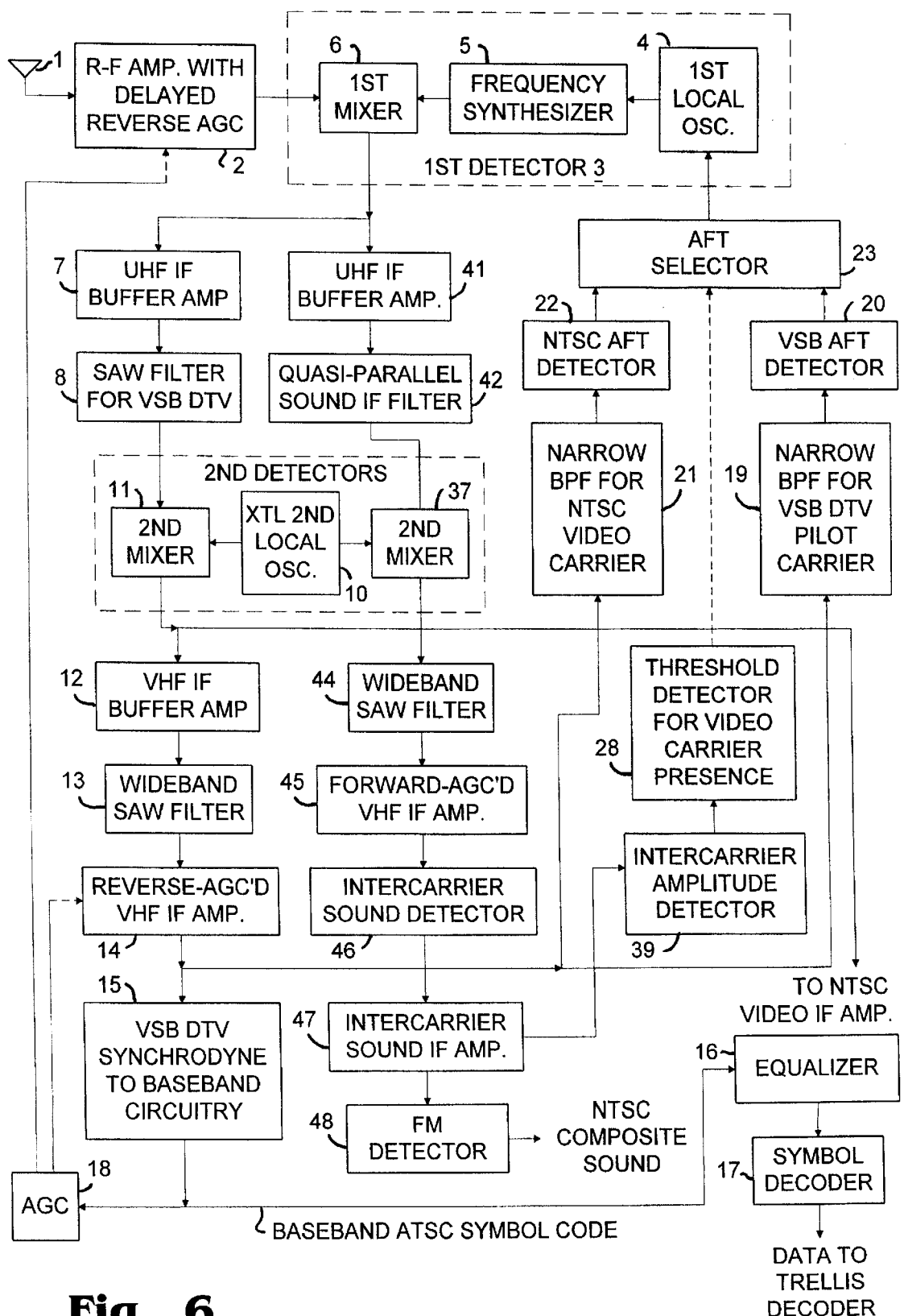
FIG. 6 shows the AFT circuitry including an AFT selector, which AFT selector selects AFT signal from an AFT detector tuned to video carrier frequency when a threshold detector senses the presence of video carrier in the response of an amplitude detector responsive to the level of intercarrier-sound intermediate-frequency signal generated from the response of a quasi-parallel sound intermediate-frequency amplifier, and which AFT selector otherwise selects AFT signal from an AFT detector tuned to DTV pilot frequency.
Figure 7:
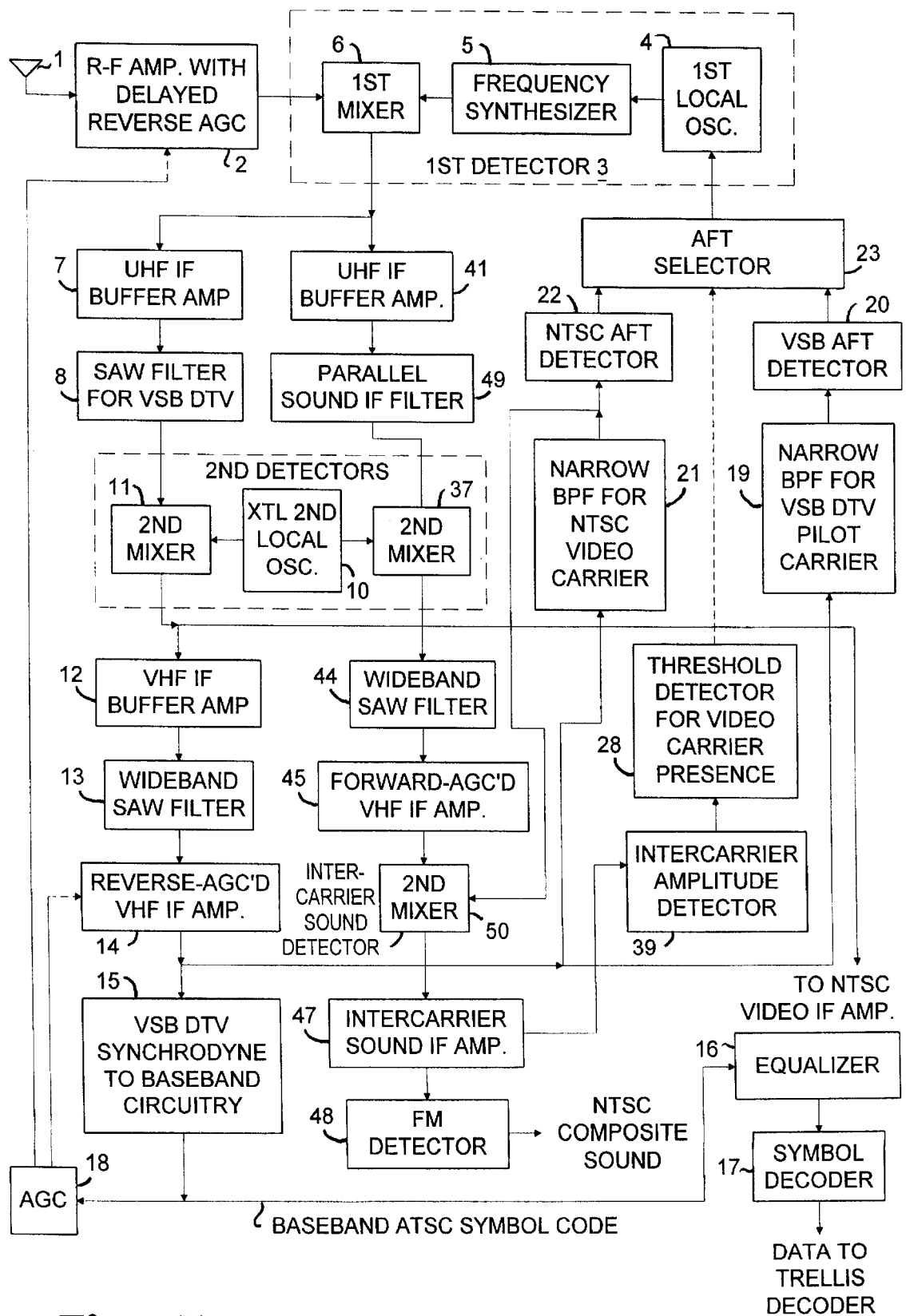
FIG. 7 shows the AFT circuitry including an AFT selector, which AFT selector selects AFT signal from an AFT detector tuned to video carrier frequency when a threshold detector senses the presence of video carrier in the response of an amplitude detector responsive to the level of intercarrier-sound intermediate-frequency signal generated from the response of a parallel sound intermediate-frequency amplifier, and which AFT selector otherwise selects AFT signal from an AFT detector tuned to DTV pilot frequency.

FIGS. 6 and 7 show some of the radio receiver portions of a television receiver capable of receiving either analog TV signals or digital TV signals, with the AFT signal selector 23 being controlled by an alternative form of means for determining when the TV signal currently being received is a VSB. DTV signal, which replaces the video peak detector 27 and the threshold detector 28 with an intercarrier amplitude detector 39 and a threshold detector 40. The threshold detector 40 determines the TV signal currently being received is a VSB DTV signal when the response of the intercarrier amplitude detector 39 to amplified intercarrier sound intermediate-frequency signal exceeds a prescribed threshold value.

In FIG. 6 the amplified intercarrier sound IF signal, which is a frequency-modulated 4.5 MHz signal, is developed using a quasi-parallel sound IF amplifier chain. The UHF IF signal supplied from the first detector 3 as its output signal is applied via a buffer amplifier 41 to a surface-acoustic-wave filter 42 providing a double-humped amplitude response with peaks at NTSC audio and video carriers as translated to UHF intermediate frequencies and with a saddle down 10 dB or more therebetween, as well as adjacent channel trapping. The UHF response of the SAW filter 42 is downconverted to VHF IF band by a second detector comprising the second local oscillator 11 and a second mixer 43 for multiplicatively mixing the SAW filter 42 response with second local oscillations from the second local oscillator 11. The resulting output signal from the second mixer 43 is supplied as input signal to a surface-acoustic-wave filter 44 that has a substantially linear-phase, flat-amplitude response over a bandwidth in excess of 6 MHz. The SAW filter 44 responds to the VHF IF component of the second mixer 43 output signal and suppresses its UHF image, in supplying input signal to an amplifier 45 having automatic gain control. The amplifier 45 is preferably similar in its construction to another amplifier having automatic gain control, which other amplifier is used for supplying a video detector with amplified NTSC video carrier modulation as translated to VHF intermediate frequencies. The composite video signal reproduced by the video detector when an NTSC analog TV signal is received is used to develop AGC signals for parallel application to the amplifier 45 and to the amplifier supplying the video detector with amplified NTSC video carrier modulation. The amplified VHF IF output signal from the amplifier 45 is supplied to an intercarrier sound detector 46, which mixes the video carrier with the FM audio carrier in an exalted detection process that generates an FM 4.5 MHz intercarrier-sound intermediate-frequency signal. The intercarrier sound detector 46 is a non-linear device, such as the rectifier in a simple envelope detector, which device generates intercarrier input signal for an intercarrier sound IF amplifier 47. The intercarrier sound IF amplifier 47 supplies an amplified intercarrier sound IF signal to an FM detector 48 as input signal thereto, which input signal customarily is symmetrically limited as to peak excursions. When an NTSC analog TV signal is being received, the FM detector 48 recovers baseband composite NTSC sound signal for use in the sound processing circuitry of the TV receiver. The intercarrier sound IF amplifier 47 also supplies to the intercarrier amplitude detector 39 an amplified intercarrier sound IF signal the peak excursions of which are not limited until signal strength of the amplified intercarrier sound IF signal as detected by the intercarrier amplitude detector 39 suffices to exceed the threshold value that the threshold detector 40 requires be exceeded for determining that a received TV signal is an analog rather than a digital TV signal transmission. This can be arranged by supplying the intercarrier amplitude detector 39 amplified intercarrier sound IF signal from a stage of the intercarrier sound IF amplifier 47 preceding a final stage or two arranged to exhibit limiting of peak excursions of its response.

In FIG. 7 the amplified intercarrier sound IF signal is developed using a parallel sound IF amplifier chain. The surface-acoustic-wave filter 42 providing a double-humped amplitude response with peaks at NTSC audio and video carriers as translated to UHF intermediate frequencies in FIG. 6 is replaced in FIG. 7 by a surface-acoustic-wave filter 49 providing a narrowband amplitude response to the NTSC FM audio carrier as translated to UHF intermediate frequencies. In FIG. 7 the intercarrier sound detector is a third mixer 50 rather than a non-linear device as in FIG. 6. The third mixer 50 multiplicatively mixes NTSC video carrier, as translated to the VHF IF band and then selected by the narrow bandpass filter 21, with the NTSC FM audio carrier, as translated to the VHF IF band and then amplified by the amplifier 45. In variants of the FIG. 7 circuitry the third mixer 50 multiplicatively mixes NTSC video carrier, as translated to the VHF IF band in an IF amplifier chain for NTSC video signal, with the NTSC FM audio carrier, as translated to the VHF IF band and then amplified by the amplifier 45.

Frequency-modulated 4.5 MHz intercarrier signal is present in output signal from the intercarrier sound IF amplifier 47 only when NTSC analog TV signals are being received either intentionally or because of strong co-channel interference during DTV signal reception. Both the video carrier and the audio carrier of the NTSC signal must be present for intercarrier signal to be present in output signal from the intercarrier sound IF amplifier 47. Simply detecting the presence of the audio carrier of the NTSC signal in the amplified VH IF signal from the amplifier 45 for determining that the received TV signal is an NTSC analog TV signal is possible. However, there is no assurance that there is in fact a video carrier present from which to develop an AFT signal. There is the possibility that the use of NTSC FM audio carrier transmissions will persist even after NTSC video carrier transmissions are discontinued, better to avoid unused spectrum.

FIG. 9 shows portions of a digital television receiver suited for use after the transition era in which analog TV broadcasting continues still to be done, in which receiver AFT circuitry is used to align the received digital television signal as translated to an ultra-high frequency (UHF) intermediate-frequency band, so that filtering in a UHF intermediate-frequency amplifier can establish the system channel response specified by the ATSC data broadcast standard. The FIG. 9 receiver portions differ from those of FIG. 1 in that elements 21–25 are dispensed with, since there will no longer be need for automatically fine-tuning NTSC analog television signal. The first local oscillator 4 receives the output signal of the VSB AFT detector 20 as its AFPC signal. The FIG. 1 SAW filter 8 for UHF IF signal having a substantially linear-phase response and having an amplitude response that has a bandwidth of 5.7–6.0 MHz is replaced by a surface-acoustic-wave filter 08 for establishing substantially the system channel response specified by the ATSC data broadcast standard. That is, the SAW filter 08 establishes a substantially linear-phase response and a flat-amplitude response having a −3 dB to −3 dB bandwidth of 5.38 MHz. Some departure from the exact system channel response specified by the ATSC data broadcast standard is preferable to allow for adjacent-channel rejection traps near edges of the channel selected for reception, but the system channel response specified by the ATSC data broadcast standard is preferably adhered to quite closely in the portion of the channel frequency spectrum specified to contain appreciable signal energy. The SAW filter 13 in the VHF IF amplifier portion of the FIG. 9 circuitry has a substantially linear-phase, flat-amplitude response over a bandwidth in excess of 6 MHz. The FIG. 1 narrow bandpass filter 19 for VHF IF signal is replaced by a narrow bandpass filter 019 with more pronounced tilt in its amplitude response, to compensate not only for roll-off through carrier frequency introduced at the transmitter but also for roll-off through carrier frequency introduced in the IF amplifier chain.

FIG. 10 shows portions of a digital television receiver in which receiver portions AFT circuitry is used to align the received digital television signal as translated to a very high frequency (VHF) intermediate-frequency band after having been translated to a UHF intermediate-frequency band, so that filtering in a VHF intermediate-frequency amplifier can establish the system channel response specified by the ATSC data broadcast standard. The FIG. 10 receiver portions differ from those of FIG. 1 in that elements 21–25 are dispensed with, since there will no longer be need for automatically fine-tuning NTSC analog television signal. The first local oscillator 4 receives the output signal of the VSB AFT detector 20 as its AFPC signal. The FIG. 1 SAW filter 8 for UHF IF signal having a substantially linear-phase response and having an amplitude response that has a bandwidth of 5.7–6.0 MHz is retained in the FIG. 10 receiver portions. The wideband SAW filter 13 of FIG. 1 is replaced by a surface-acoustic-wave filter 013 for establishing the system channel response specified by the ATSC data broadcast standard. That is, the SAW filter 013 establishes a substantially linear-phase response and a flat-amplitude response having a −3 dB to −3 dB bandwidth of 5.38 MHz. The FIG. 1 narrow bandpass filter 19 for VHF IF signal is replaced by the narrow bandpass filter 019 with more pronounced tilt in its amplitude response, to compensate not only for roll-off through carrier frequency introduced at the transmitter but also for roll-off through carrier frequency introduced in the IF amplifier chain.

FIG. 11 shows portions of a digital television receiver in which AFT circuitry is used to align the received digital television signal as translated to a very high frequency (VHF) band without having been translated to a UHF IF band, so that filtering in a VHF intermediate-frequency amplifier can establish the system channel response specified by the ATSC data broadcast standard. The FIG. 11 DTV receiver circuitry differs from that of FIG. 10 in that the first detector 3 for converting received DTV signal to a UHF IF band is replaced by a first detector 03 for converting received DTV signal to a VHF IF band. The UHF IF buffer amplifier 7, the SAW filter 8 for UHF IF signal, and the second detector 9 of the FIG. 10 DTV receiver circuitry are dispensed with in the FIG. 11 DTV receiver circuitry. The first detector 03 comprises a first local oscillator 04 with automatic fine tuning, a frequency synthesizer 05 for generating super-heterodyning signal of a frequency in selected offset from the frequency of the first local oscillator, and a first mixer 06 for mixing the selected radio-frequency signal with the super-heterodyning signal to generate a VHF intermediate-frequency signal supplied to the VHF IF buffer amplifier 12. The first mixer 06 includes an image-suppression filter, not explicitly shown in FIG. 11 for suppressing the image of that IF signal in its output signal and is preferably of a doubly-balanced linear-multiplication type.

FIGS. 12, 13 and 14 show a modification of the portions of a digital television receiver shown in FIGS. 9, 10 and 12, respectively. The modification boosts the pilot carrier amplitude in the VHF IF signal supplied to the synchrodyning circuitry 15. The response of the VHF IF amplifier 14 is not supplied directly to the synchrodyning circuitry 15 in FIGS. 12, 13 and 14. Instead, the VHF IF amplifier 14 response is supplied as input signal to a very narrow bandpass filter 90 containing pilot carrier frequency its bandpass response and to a signal combiner 91 as one of its input signals. The other input signal to signal combiner 91 is the response of the very narrow bandpass filter 90 to pilot carrier. The output signal from the signal combiner 91 is a VHF IF signal with pilot carrier amplitude boosted, which output signal is applied to the synchrodyning circuitry 15 as an input signal thereto. The bandwidth of the very narrow bandpass filter 90 preferably is no more than a few hundred hertz. The filter 90 should be linear phase and preferably affords tilted amplitude response, to compensate for roll-offs through carrier frequency introduced at the transmitter and in the IF amplifier chain. AFT is used in the receiver circuitry of FIGS. 12, 13 and 14 to assure that the pilot carrier is aligned with the peak response of the very narrow bandpass filter 90. The signal combiner 91 is an adder or a weighted adder, by way of specific examples.

FIGS. 15, 16 and 17 show a further modification of the portions of a digital television receiver shown in 12, 13 and 14, respectively. Instead of the AFT detector 20 being continually supplied the response of the narrow bandpass filter 19 as input signal, an AFT selector 92 is connected for supplying input signal to the AFT detector 20. A frequency lock detector 93 associated with the synchrodyning circuitry 15 detects when the AFT loop brings the DTV signal as translated to a final intermediate frequency within the lock-in range of the synchrodyning circuitry 15. The lock-in range of the synchrodyning circuitry 15 is designed to be sufficiently small that alignment of the pilot carrier within the passband of the very narrow bandpass filter 90 is assured when frequency lock is achieved. When the frequency lock detector 93 supplies indication to the AFT selector 92 that frequency lock is not achieved, the AFT selector 92 is conditioned to supply the AFT detector 20 an input signal corresponding to the response of the narrow bandpass filter 19, so a pull-in range of ±10 kilohertz or so is available for AFT. When the frequency lock detector 93 supplies indication to the AFT selector 92 that frequency lock is achieved, the AFT selector 92 is conditioned to supply the AFT detector 20 an input signal corresponding to the response of the very narrow bandpass filter 90 reducing pull-in range to no more than a few hundred hertz. This affords the AFT loop better protection against radio-frequency interference when it is in lock.

The frequency lock detector 93 is constructed as follows, for example, when the synchrodyning circuitry 15 is of a type in which a synchrodyning local oscillator is included, and in which the VHF IF input signal to the synchrodyning circuitry 15 is subjected to narrow bandpass filtering before being synchrodyned to baseband to generate the quadrature-phase synchronous detection result used to generate an automatic-frequency-and-phase-control (AFPC) signal for the synchrodyning local oscillator. In the frequency lock detector 93 the quadrature-phase synchronous detection result is passed through a direct-current-blocking capacitor, lowpass filtered with a and resistance-coupled to a peak detector. The peak detector response is supplied to a threshold detector in the frequency lock detector 93. Before frequency lock is achieved in the AFPC loop for the synchrodyning local oscillator, the quadrature-phase synchronous detection result will reproduce the beats between the oscillations of the synchrodyning local oscillator and the received.

The filters 019 and 90 may have additional input and/or output buffer amplifier stages associated with them in other embodiments of the invention. A buffer amplifier allows the very narrow bandpass filter 90 to be cascaded after the narrow bandpass filter 019 in variants of the circuitry shown in the drawing, rather than these filters 019 and 90 being driven in parallel from the VHF IF amplifier 14. The tilt in filter 019 amplitude response modifies the design of the filter 90 cascaded thereafter so it does not have amplitude tilt through passband.

While the frequency-selective filtering employed in the IF amplifier chains of the preferred embodiments of the invention described above roll-off the channel response distal from carrier frequency in accordance with the system channel response specified within the ATSC data broadcast standard, embodiments of the invention where the roll-off of channel response distal from carrier frequency is further from carrier frequency are feasible where the Viterbi algorithm is employed during symbol decoding. The roll-off of the channel response proximate to carrier frequency, so as to avoid the folding of noise and adjacent channel spill-over into the baseband response during demodulation, is still an important consideration in receivers employing the Viterbi algorithm for symbol decoding. AFT is still important in such receivers for assuring that low-frequency components of modulation are in correct proportion to high-frequency components of modulation.

AFT is important in DTV receivers that store previous values of equalization filter parameters for each channel in memory, so as to facilitate rapid retuning to a previously tuned channel. AFT voltages and antenna settings for previously tuned channels should also be stored in the memory, in order that the previous values of equalization filter parameters for each channel stored in the memory can properly restore previous reception conditions.

One skilled in the art of radio receivers for television or for digital communications will by acquaintance with this disclosure be enabled readily to design other embodiments of the invention, and this should be taken into account when construing the scopes of the claims which follow. In the claims which follow, the word "said" is used whenever reference is made to an antecedent, and the word "the" is used for grammatical purposes other than to refer back to an antecedent.

What is claimed is:

1. A radio receiver for selectively receiving one of a plurality of television signals transmitted through respective television broadcast channels, at least some of which television signals are digital television signals transmitted by suppressed carrier vestigial sideband modulation with an unmodulated pilot carrier of the same frequency as the suppressed carrier in accordance with a data broadcast standard for terrestrial through-the-air television broadcasting in the United States of America, in which said data broadcast standard the pilot carriers of said digital television signals are at suppressed carrier frequencies substantially closer than 1.25 megahertz to limit frequencies of said television broadcast channels, said radio receiver comprising:

circuitry for selecting said television signal currently being received, which circuitry includes a first detector for generating a first detector output signal;

a first local oscillator included within said first detector, for supplying first local oscillations of adjustable frequency which frequency can be fine-tuned responsive to an electric fine-tuning signal;

a first mixer included within said first detector for multiplicatively mixing said television signal currently being received with said first local oscillations to generate said first detector output signal;

an intermediate-frequency amplifier chain for supplying an amplified response to said first detector output signal;

frequency-selective filtering connected within said intermediate-frequency amplifier chain, which frequency-selective filtering provides selective response to said one of said digital television signals currently selected for reception, such that certain frequencies of said first detector output signal are amplified less than others in said amplified response to said first detector output signal supplied by said intermediate-frequency amplifier chain;

circuitry for synchrodyning said amplified response supplied by said intermediate-frequency amplifier chain to baseband when said television signal currently being received is a digital television signal, thereby to generate a baseband symbol coding signal;

symbol decoding circuitry for decoding said baseband symbol coding signal to reproduce a datastream, as transmitted in accordance with said data broadcast standard;

a first bandpass filter providing selective response to the amplified response supplied by said intermediate-frequency amplifier chain for selecting said digital television signal pilot carrier as translated to intermediate frequency; and an automatic fine-tuning detector tuned for said digital television signal pilot carrier as translated to intermediate frequency, receptive at least at times of the selective response of said first bandpass filter as input signal thereto and supplying an output signal therefrom which is applied as said electric fine-tuning signal to said first local oscillator included within said first detector when said television signal currently being received is a digital television signal, thereby completing an automatic fine-tuning feedback loop.

2. The radio receiver of claim 1, wherein said frequency-selective filtering is of a type for causing said amplified response supplied by said intermediate-frequency amplifier chain substantially to correspond to system channel response specified within said data broadcast standard.

3. The radio receiver of claim 2, wherein said frequency-selective filtering generates said amplified response that is essentially a linear-phase raised-cosine filter response to said digital television signal transmitted in accordance with said data broadcast standard and selected for current reception.

4. The radio receiver of claim 2, wherein said frequency-selective filtering includes adjacent-channel rejection traps near edges of the channel selected for reception.

5. The radio receiver of claim 1, wherein said frequency-selective filtering generates said amplified response to said first detector output signal as essentially a linear-phase raised-cosine filter response that is 6 dB down at 5.38 MHz bandwidth to said digital television signal transmitted in accordance with said data broadcast standard and selected for current reception.

6. The radio receiver of claim 5, wherein said frequency-selective filtering includes adjacent-channel rejection traps near edges of the channel selected for reception.

7. The radio receiver of claim 1, wherein said frequency-selective filtering boosts the suppressed carrier frequency portion of the one of said digital television signals currently selected for reception compared to the other frequencies thereof.

8. The radio receiver of claim 1, further comprising:
a second bandpass filter connected to provide selective response to the amplified response supplied by said first intermediate-frequency amplifier chain for selecting said digital television signal pilot carrier as translated to intermediate frequency, the bandwidth of said second bandpass filter being narrower than the bandwidth of said first bandpass filter, the response of said second bandpass filter augmenting said amplified response of said amplified response to said first detector output signal as supplied to said circuitry for synchrodyning said amplified response supplied by said intermediate-frequency amplifier chain to baseband.

9. The radio receiver of claim 8, further comprising:
a frequency lock detector connected to sense when frequency lock to suppressed carrier component of said amplified response is achieved by said circuitry for synchrodyning said amplified response supplied by said intermediate-frequency amplifier chain to baseband and to provide indications of whether or not such frequency lock currently obtains; and
a selector, responsive to said frequency lock detector providing an indication that frequency lock currently does not obtain for applying the selective response of said first bandpass filter to said automatic fine-tuning detector as said input signal thereof, and responsive to said frequency lock detector providing an indication that frequency lock currently does obtain for applying the selective response of said second bandpass filter to said automatic fine-tuning detector as said input signal thereof.

10. The radio receiver of claim 1, wherein said frequency-selective filtering generates said amplified response to said first detector output signal that is rolled off to be essentially 6 dB down at carrier frequency when said digital television signal currently being received is transmitted in accordance with said data broadcast standard.

11. The radio receiver of claim 10, wherein the frequency of oscillations from said first local oscillator is such that said first mixer generates said first detector output signal as a very-high frequency signal.

12. The radio receiver of claim 1, wherein the frequency of oscillations from said first local oscillator is such that said first mixer generates said first detector output signal as an ultra-high frequency signal, and wherein said intermediate-frequency amplifier chain comprises:
an ultra-high-frequency amplifier responsive to said first detector output signal to supply an ultra-high-frequency amplifier response, said frequency-selective filtering being connected with said ultra-high-frequency amplifier to cause said certain frequencies of the signal amplified in said ultra-high-frequency amplifier response to be amplified less than said others;
a second detector for generating a very-high-frequency second detector output signal;
a second local oscillator included within said second detector, for supplying second local oscillations of fixed frequency;
a second mixer included within said second detector for multiplicatively mixing said ultra-high-frequency intermediate-frequency amplifier response with said second local oscillations to generate said second detector output signal; and
a very-high-frequency intermediate-frequency amplifier providing a very-high-frequency intermediate-frequency amplifier output signal in amplified response to said second detector output signal, thereby to provide said amplified response of said intermediate-frequency amplifier chain to said first detector output signal.

13. The radio receiver of claim 12, wherein said frequency-selective filtering is of a type for causing said amplified response supplied by said intermediate-frequency amplifier chain substantially to correspond to system channel response specified within said data broadcast standard.

14. The radio receiver of claim 13, wherein said frequency-selective filtering generates said amplified response that is essentially a linear-phase raised-cosine filter response to said digital television signal transmitted in accordance with said data broadcast standard and selected for current reception.

15. The radio receiver of claim 13, wherein said frequency-selective filtering includes adjacent-channel rejection traps near edges of the channel selected for reception.

16. The radio receiver of claim 12, wherein said frequency-selective filtering generates said amplified response to said first detector output signal as essentially a linear-phase raised-cosine filter response that is 6 dB down at 5.38 MHz bandwidth to said digital television signal transmitted in accordance with said data broadcast standard and selected for current reception.

17. The radio receiver of claim 16, wherein said frequency-selective filtering includes adjacent-channel rejection traps near edges of the channel selected for reception.

18. The radio receiver of claim 12, wherein said frequency-selective filtering boosts the suppressed carrier frequency portion of the one of said digital television signals currently selected for reception compared to the other frequencies thereof.

19. The radio receiver of claim 12, further comprising:
a second bandpass filter connected to provide selective response to the amplified response supplied by said first internediate-frequency amplifier chain for selecting said digital television signal pilot carrier as translated to intermediate frequency, the bandwidth of said second bandpass filter being narrower than the bandwidth of said first bandpass filter, the response of said second bandpass filter augmenting said amplified response of said amplified response to said first detector output signal as supplied to said circuitry for synchrodyning said amplified response supplied by said intermediate-frequency amplifier chain to baseband.

20. The radio receiver of claim 19, further comprising:
a frequency lock detector connected to sense when frequency lock to suppressed carrier component of said amplified response is achieved by said circuitry for synchrodyning said amplified response supplied by said intermediate-frequency amplifier chain to baseband and to provide indications of whether or not such frequency lock currently obtains; and a selector, responsive to said frequency lock detector providing an indication that frequency lock currently does not obtain for applying the selective response of said first bandpass filter to said automatic fine-tuning detector as said input signal thereof, and responsive to said frequency lock detector providing an indication that frequency lock currently does obtain for applying the selective response of said second bandpass filter to said automatic fine-tuning detector as said input signal thereof.

21. The radio receiver of claim 12, wherein said frequency-selective filtering generates said amplified response to said first detector output signal that is rolled off to be essentially 6 dB down at carrier frequency when said digital television signal currently being received is transmitted in accordance with said data broadcast standard.

22. The radio receiver of claim 1, wherein the frequency of oscillations from said first local oscillator is such that said first mixer generates said first detector output signal as an ultra-high frequency signal, and wherein said intermediate-frequency amplifier chain comprises:

an ultra-high-frequency amplifier responsive to said first detector output signal to supply an ultra-high-frequency amplifier response;

a second detector for generating a very-high-frequency second detector output signal;

a second local oscillator included within said second detector, for supplying second local oscillations of fixed frequency;

a second mixer included within said second detector for multiplicatively mixing said ultra-high-frequency intermediate-frequency amplifier response with said second local oscillations to generate said second detector output signal; and a very-high-frequency intermediate-frequency amplifier providing a very-high-frequency intermediate-frequency amplifier response to said second detector output signal thereby to provide said amplified response of said intermediate-frequency amplifier chain to said first detector output signal, said frequency-selective filtering being connected with said very-high-frequency amplifier to cause said certain frequencies of the signal amplified in said very-high-frequency amplifier response to be amplified less than said others.

23. The radio receiver of claim 22, wherein said frequency-selective filtering is of a type for causing said amplified response supplied by said intermediate-frequency amplifier chain substantially to correspond to system channel response specified within said data broadcast standard.

24. The radio receiver of claim 23, wherein said frequency-selective filtering generates said amplified response that is essentially a linear-phase raised-cosine filter response to said digital television signal transmitted in accordance with said data broadcast standard and selected for current reception.

25. The radio receiver of claim 23, wherein said type of frequency-selective filtering includes adjacent-channel rejection traps near edges of the channel selected for reception.

26. The radio receiver of claim 22, wherein said frequency-selective filtering generates said amplified response to said first detector output signal as essentially a linear-phase raised-cosine filter response that is 6 dB down at 5.38 MHz bandwidth to said digital television signal transmitted in accordance with said data broadcast standard and selected for current reception.

27. The radio receiver of claim 26, wherein said type of frequency-selective filtering includes adjacent-channel rejection traps near edges of the channel selected for reception.

28. The radio receiver of claim 22, wherein said frequency-selective filtering boosts the suppressed carrier frequency portion of the one of said digital television signals currently selected for reception compared to the other frequencies thereof.

29. The radio receiver of claim 22, further comprising:

a second bandpass filter connected to provide selective response to the amplified response supplied by said first intermediate-frequency amplifier chain for selecting said digital television signal pilot carrier as translated to intermediate frequency, the bandwidth of said second bandpass filter being narrower than the bandwidth of said first bandpass filter, the response of said second bandpass filter augmenting said amplified response of said amplified response to said first detector output signal as supplied to said circuitry for synchrodyning said amplified response supplied by said intermediate-frequency amplifier chain to baseband.

30. The radio receiver of claim 29, further comprising:

a frequency lock detector connected to sense when frequency lock to suppressed carrier component of said amplified response is achieved by said circuitry for synchrodyning said amplified response supplied by said intermediate-frequency amplifier chain to baseband and to provide indications of whether or not such frequency lock currently obtains; and a selector, responsive to said frequency lock detector providing an indication that frequency lock currently does not obtain for applying the selective response of said first bandpass filter to said automatic fine-tuning detector as said input signal thereof, and responsive to said frequency lock detector providing an indication that frequency lock currently does obtain for applying the selective response of said second bandpass filter to said automatic fine-tuning detector as said input signal thereof.

31. The radio receiver of claim 22, wherein said frequency-selective filtering generates said amplified response to said first detector output signal that is rolled off to be essentially 6 dB down at carrier frequency when said digital television signal currently being received is transmitted in accordance with said data broadcast standard.

32. The radio receiver of claim 1, wherein the frequency of oscillations from said first local oscillator is such that said first mixer generates said first detector output signal as a very-high frequency signal, and wherein said frequency-selective filtering is of a type for causing said amplified response supplied by said intermediate-frequency amplifier chain substantially to correspond to system channel response specified within said data broadcast standard.

33. The radio receiver of claim 32, wherein said frequency-selective filtering generates said amplified response that is essentially a linear-phase raised-cosine filter response to said digital television signal transmitted in accordance with said data broadcast standard and selected for current reception.

34. The radio receiver of claim 32, wherein said frequency-selective filtering includes adjacent-channel rejection traps near edges of the channel selected for reception.

35. The radio receiver of claim 1, wherein the frequency of oscillations from said first local oscillator is such that said first mixer generates said first detector output signal as a very-high frequency signal, and wherein said frequency-selective filtering generates said amplified response to said first detector output signal as essentially a linear-phase raised-cosine filter response that is 6 dB down at 5.38 MHz bandwidth to said digital television signal transmitted in accordance with said data broadcast standard and selected for current reception.

36. The radio receiver of claim 34, wherein said frequency-selective filtering includes adjacent-channel rejection traps near edges of the channel selected for reception.

37. The radio receiver of claim 1, wherein the frequency of oscillations from said first local oscillator is such that said first mixer generates said first detector output signal as a very-high frequency signal, and wherein said frequency-selective filtering boosts the suppressed carrier frequency portion of the one of said digital television signals currently selected for reception compared to the other frequencies thereof.

38. The radio receiver of claim 1, wherein the frequency of oscillations from said first local oscillator is such that said first mixer generates said first detector output signal as a very-high frequency signal, said radio receiver further comprising:

a second bandpass filter connected to provide selective response to the amplified response supplied by said first intermediate-frequency amplifier chain for selecting said digital television signal pilot carrier as translated to intermediate frequency, the bandwidth of said second bandpass filter being narrower than the bandwidth of said first bandpass filter, the response of said second bandpass filter augmenting said amplified response of said amplified response to said first detector output signal as supplied to said circuitry for synchrodyning said amplified response supplied by said intermediate-frequency amplifier chain to baseband.

39. The radio receiver of claim 38, further comprising:

a frequency lock detector connected to sense when frequency lock to suppressed carrier component of said amplified response is achieved by said circuitry for synchrodyning said amplified response supplied by said intermediate-frequency amplifier chain to baseband and to provide indications of whether or not such frequency lock currently obtains; and a selector, responsive to said frequency lock detector providing an indication that frequency lock currently does not obtain for applying the selective response of said first bandpass filter to said automatic fine-tuning detector as said input signal thereof, and responsive to said frequency lock detector providing an indication that frequency lock currently does obtain for applying the selective response of said second bandpass filter to said automatic fine-tuning detector as said input signal thereof.

40. The radio receiver of claim 39, wherein said frequency-selective filtering generates said amplified response to said first detector output signal that is rolled off to be essentially 6 dB down at carrier frequency when said digital television signal currently being received is transmitted in accordance with said data broadcast standard.

41. A radio receiver for selectively receiving one of a plurality of television signals transmitted through respective television broadcast channels, at least some of which television signals are digital television signals transmitted by suppressed carrier vestigial sideband modulation with an unmodulated pilot carrier of the same frequency as the suppressed carrier in accordance with a data broadcast standard for terrestrial through-the-air television broadcasting in the United States of America, in which said data broadcast standard the pilot carriers of said digital television signals are at suppressed carrier frequencies substantially closer than 1.25 megahertz to limit frequencies of said television broadcast channels, said radio receiver comprising:

circuitry for selecting said television signal currently being received, which circuitry includes a first detector for generating a first detector output signal;

a first local oscillator included within said first detector, for supplying first local oscillations of adjustable frequency which frequency can be fine-tuned responsive to an electric fine-tuning signal;

a first mixer included within said first detector for multiplicatively mixing said television signal currently being received with said first local oscillations to generate said first detector output signal;

an intermediate-frequency amplifier chain for supplying an amplified response to said first detector output signal;

circuitry for synchrodyning said amplified response supplied by said intermediate-frequency amplifier chain to baseband when said television signal currently being received is a digital television signal, thereby to generate a baseband symbol coding signal;

symbol decoding circuitry for decoding said baseband symbol coding signal to reproduce a datastream, as transmitted in accordance with said data broadcast standard;

a bandpass filter providing selective response to the amplified response supplied by said first intermediate-frequency amplifier chain for selecting said digital television signal pilot carrier as translated to intermediate frequency, said bandpass filter exhibiting a tilted amplitude response in passband that compensates for the roll-off through the carrier region of the amplified response supplied by said intermediate-frequency amplifier chain; and an automatic fine-tuning detector tuned for said digital television signal pilot carrier as translated to intermediate frequency, receptive at least at times of the selective response of said bandpass filter as input signal thereto and supplying an output signal therefrom which is applied as said electric fine-tuning signal to said first local oscillator included within said first detector when said television signal currently being received is a digital television signal, thereby completing an automatic fine-tuning feedback loop.

* * * * *